(12) United States Patent
Fure et al.

(10) Patent No.: US 6,753,507 B2
(45) Date of Patent: Jun. 22, 2004

(54) WAFER HEATING APPARATUS

(75) Inventors: Hiroshi Fure, Kokubu (JP); Koichi Nagasaki, Kokubu (JP); Kyoji Uchiyama, Kokubu (JP)

(73) Assignee: Kyocera Corporation, Kyoto (JP)

( * ) Notice: Subject to any disclaimer, the term of this patent is extended or adjusted under 35 U.S.C. 154(b) by 188 days.

(21) Appl. No.: 10/134,294

(22) Filed: Apr. 26, 2002

(65) Prior Publication Data

US 2003/0015517 A1 Jan. 23, 2003

(30) Foreign Application Priority Data

Apr. 27, 2001 (JP) ..................................... P2001-133232
Apr. 27, 2001 (JP) ..................................... P2001-133632
May 30, 2001 (JP) ..................................... P2001-163298

(51) Int. Cl.⁷ ............................................... H05B 3/68
(52) U.S. Cl. ................. 219/444.1; 219/465.1; 219/466.1; 219/467.1; 219/543; 219/544; 219/546; 219/548; 118/724; 118/725; 118/728
(58) Field of Search ........................... 219/444.1, 465.1, 219/466.1, 467.1, 543, 544, 546, 547, 548; 118/724, 725, 728

(56) References Cited

U.S. PATENT DOCUMENTS 3,895,216 A  *  7/1975  Hurko ........................ 219/462

5,828,810 A  *  10/1998  Frank et al. ................. 392/502
6,072,162 A  *  6/2000  Ito et al. .................. 219/444.1

FOREIGN PATENT DOCUMENTS

JP          08-070007        3/1996
JP          11-283729        10/1999

* cited by examiner

Primary Examiner—Shawntina Fuqua
(74) Attorney, Agent, or Firm—Hogan & Hartson

(57) ABSTRACT

In a ceramic heater having a plate-like body made of a ceramic, heating element in one main face of the plate like body, and an electric supply portion to be electrically connected with the heating element, it has been a problem that the temperature is uneven if bent portions are formed in heat generating patterns. The ceramic heater simultaneously satisfying the following: $0.15 \leq S \leq 0.85$, $0.3 \leq P \leq 6.71 \times S^2 + 1.52$, and $0.3 \leq G \leq 6.71 \times (1-S)^2 + 1.55$, in which the reference character S1 denotes the surface area of the heating element in optional 10 mm square region of the effective heat generation area having the heating element therein; the surface ratio S denotes $S = S1/100$ mm², the reference character P denotes the width of the heating element: and the reference character G denotes the gap between the heating element.

11 Claims, 9 Drawing Sheets

WAFER HEATING APPARATUS

BACKGROUND OF THE INVENTION

1. Field of the Invention

The present invention relates to a wafer heating apparatus to be employed for heating mainly a wafer and a ceramic heater to be employed for the apparatus and for example to a wafer heating apparatus suitable for forming a semiconductor thin film on a semi conductor wafer, a liquid crystal substrate, a circuit board or the like and for forming a resist film by drying and baking a resist liquid applied to the water.

2. Prior Art

In semiconductor thin film formation treatment, etching treatment, resist film baking treatment and the like in semiconductor device fabrication process, a wafer heating apparatus is employed for heating a semiconductor wafer.

Conventionally, the wafer heating apparatus has been made to be a batch type apparatus for carrying out film formation treatment of a plurality of wafers. Along with the recent tendency to enlarge a wafer size from 8 to 12 inches, a sheet-fed manner for heating wafers one by one has been employed to increase the treatment precision.

In the sheet-fed manner, the number of wafers to be heated by one time treatment is lessened, so that wafer treatment time is required to be shortened. Accordingly, a wafer supporting member is required to be suitable for shortening the wafer heating duration and quickening the vacuum attachment, transportation, and vacuum detachment of wafers, and at the same time, the heating temperature precision of a heater is required to be improved.

As an example of such a wafer heating apparatus described above, Japanese Patent Publication No. 11-283729 discloses a wafer heating apparatus, as illustrated in FIG. 12, including main components of a support 31, a heat homogenizing plate 22, and a stainless steel plate 33 as a plate reflection body. The support 31 is a bottomed member made of aluminum and having an opening 34 with a circular cross-section shape in the upper side. In the center part of the support 31, three pin insertion holes 35 are formed to insert wafer supporting pins (not illustrated in the figure) into. By moving the wafer supporting pins inserted into the pin insertion holes 35 up and down, a wafer W can be transported to and from a transferring apparatus. Also, a conductor terminal 27 is soldered to the terminal part of a heating element (not illustrated in the figure) and the conductor terminal 27 is inserted in a hole 57 formed in the stainless plate 33. In the outer circumferential part of the bottom part 31a, some holes 36 for leading out lead wires are formed. Lead wires (illustrated in the figure) for supplying electric current to the heating element are inserted through the holes 36 and connected to the foregoing conductor terminal 27.

Nitride ceramics or carbide ceramics may be used for the ceramic material forming the heat homogenizing plate 22. The heating element is proposed to be resistor strips in a plurality of concentrically formed patterns, as illustrated in FIG. 13, to heat the heat homogenizing plate 22 by electricity application. A heating element 62 and electrodes 63 are formed in the heat homogenizing plate 22 and sensor installation holes 64 are also formed.

Heat Homosinizing

The heat homogenizing plate 22 of such a conventional wafer heating apparatus is required to precisely control the temperature distribution in the wafer W plane within a range of ±0.5° C. Therefore, Japanese Patent Application Laid-Open Publication No. 8-70007 proposes heating treatment of a substrate, as illustrated in FIG. 14, to be carried out while keeping a wafer W parallel to a heat homogenizing plate 22 made of aluminum and equipped with a heating means or a cooling means at a constant distance from the upper face of the heat homogenizing plate 22 by supporting the wafer W with spherical supporting pins 59 set in recessed parts 58 formed in the heat homogenizing plate 22.

In such a manner, by holding the wafer W at a distance from the heat homogenizing plate 22, even if warping or the evenness of the wafer W relative to the heat homogenizing plate 22 differs, the wafer is prevented from contact with the heat homogenizing plate and accordingly the unevenness of the temperature distribution in the wafer surface is suppressed. Further, such a structure is applied to a conventional heat homogenizing plate 22, since the heat homogenizing plate 22 itself is thick, the temperature distribution caused in a heating element 25 can be moderated owing to the thickness of the heat homogenizing plate 22. Even heating is thus made possible. However, the heat homogenizing plate 22 made of aluminum has a problem that it takes a long time to carry out heating and cooling to a set temperature and also it takes long to response to the altered set temperature due to a high thermal capacity.

In relation to that, along with requirement of fineness of semiconductor wiring, especially a photosensitive resist film is required to be heated in a widely varying temperature range. In order to shorten the heating treatment for every wafer, the thermal capacity of the heat homogenizing plate has to be small and the temperature has to be altered fast. Further, sensitive temperature control is also required from the time of setting the wafer on the heat homogenizing plate to the time of completing the heating treatment. As a heating element formed on a thin ceramic heat homogenizing plate 22 having a high toughness and a high thermal conductivity is proposed to carry out heating.

However, in such a wafer heating apparatus described above, if the thickness of the heat homogenizing plate is made thin, the temperature distribution generated by the heating element is not sufficiently moderated and the temperature of the wafer W takes a long time to become even.

Japanese Patent Application Laid-Open No. 6852 (2001) discloses a method for solving the thickness unevenness caused in the heating pattern printing direction by controlling the sheet receptivity of a heat generating unit to be less than 50 m$\Omega$/□ and making the strands of the patterned heat generating unit have curved parts. It is disclosed that the optimum range of the thickness of the heat generating unit is 1 to 50 $\mu$m and that of the width of the beat generating unit is 0.1 to 20 mm and as evaluation results by a thermoviewer, the temperature dispersion is reported to be improved to the degree of about 0.5° C.

However, the thermoviewer has an temperature measurement error depending on the uneven hue of the surface of an object to be measured and the ambient environments and therefore is impossible to carry out measurement as precisely as required temperature precision. Today, the temperature precision is required to be that measured in the state a wafer is actually mounted. For that, a temperature-measuring wafer, which is a silicon wafer in which sensors such as thermocouples, temperature-measuring resistors and the like are buried tends to be employed as a means for carrying out the measurement. When the heater disclosed in the foregoing Japanese Patent Application Laid-Open No. 6852 (2001) is subjected to measurement while such a temperature-measuring wafer is mounted on the apparatus, it is found difficult to satisfy the temperature dispersion within 0.5° C. Further, it is also found there exist points showing peculiar temperature values in the bent parts and gaps among patterns of the heating element formed for moderating the printing unevenness.

In the case of employing a conventional apparatus, even if heating is possible in a stable and saturated temperature state with even temperature distribution, when a wafer W cooled to a room temperature is mounted on a mounting face of the heating apparatus controlled to be at a prescribed temperature and heated, only the portions where the heat generation capacity is increased for even heating are sometimes heated quickly as compared with other portions to result in uneven temperature distribution during the transition time for heating. Further, only the portions where the heat generation capacity is increased cause resistance alteration quickly and cause a problem that the temperature evenness is deteriorated within a short time.

Moreover, it is possible to improve the temperature evenness along with increase of the heat capacity in a heat homogenizing plate by increasing the thickness of the heat homogenizing plate, however that results in decrease of the thermal response and insensitivity of the temperature detection of thermocouples and accordingly, leads to an adverse result in temperature dispersion during the transition time for heating.

Also, it is possible to assure the heat generation quantity corresponding to heat release by enlarging a heating element so as to set it closely to a support for supporting a heat homogenizing plate, however in such a case, the resistance of the heating element is changed quickly and the life of the heating element is shortened attributed to the mechanical load by contact with the support and effect of the thermal stress to the heat transfer to the support.

A structure in which a wafer is parted from a mounting face 53 of a heat homogenizing plate 52 by supporting pins may be employed, however in this case, the heat transmission from the heat homogenizing plate, a heat source, to the wafer is carried out by radiation heat from the entire body of the heat homogenizing plate and thermal conduction from the supporting pins in combination. If the radiation heat and the thermal conduction from the supporting pins are not in balanced, the wafer temperature sometimes becomes low in the parts of the supporting pins or contrary high. The heat transfer by radiation is affected by the radiation characteristics of the heat homogenizing plate 52 and the distance between the heat homogenizing plate and the wafer and the heat quantity by the thermal conduction alters depending on the thermal conductivity of the supporting pins. Such inconformity of the heat transmission manners results in occurrence of temperature difference-in-plane of the wafer and local change of the quality of a coating and uneven reaction of a resist film.

SUMMARY OF THE INVENTION

A object of the present invention is to provide a wafer heating apparatus capable of homogeneously heating the entire face of a wafer set on a mounting face at a prescribed temperature within a dispersion range of ±0.5° C. by a heat homogenizing plate equipped with a heating element.

Another object of the present invention is to provide a heating apparatus provided with a transitional heating property capable of shortening the duration from the time of setting a wafer at an ordinary temperature on the heat homogenizing plate to the time the wafer reaches the aimed temperature or to the time the wafer is cooled to a prescribed temperature.

Another object of the present invention is to provide a wafer heating apparatus capable of increasing the temperature of the wafer surface as evenly as possible during the heating process of the wafer at an ordinary temperature mounted on the heat homogenizing plate.

Another object of the present invention is to provide a wafer heating apparatus capable of distributing temperatures on the wafer surface as evenly as possible by keeping the balance of the heat quantity between radiation heat from the heat homogenizing plate and thermal conduction from supporting pins.

The wafer heating apparatus of the present invention includes a heat homogenizing plate of a ceramic whose one main face is set to be a mounting face for a wafer, a heating element composed of a plurality of resister strips which are formed in the other main face or buried in the inside of the heat homogenizing plate, and electric supply portions to be electrically connected with the heating element in the other main face, wherein the heating element is capable of uniformly generating heat in entire surface of the heat homogenizing plate to produce even temperature distribution in the upper face of the heat homogenizing plate by defining the area ratio S of the heating element, the width P (mm) of the resister strips, and the gap G (mm) between the adjacent resister strips so as to satisfy specified relations.

In the present invention, the area ratio S is defined as $S=S1/100$ mm$^2$: wherein S1 (mm) denotes a surface area of the resister strips in an optional portion of a 10 mm square in an effective heat generation area formed on the heat homogenizing plate. In the wafer heating apparatus of the present invention, arrangement of the resister strips in a heating element is so set as to satisfy the following relations:

$0.15 \leq S \leq 0.85;$ $0.3 \leq P \leq 6.71 \times S^2 + 1.52;$ and $0.3 \leq G \leq 6.71 \times (1-S)^2 + 1.55.$ In the present invention, by adjusting the ratio of the outer diameter of the heating element to the outer diameter of the heat homogenizing plate within a prescribed range, and specifying the thickness of the heat homogenizing plate, the wafer heating apparatus is made capable of heating a wafer with even temperature distribution in the entire wafer surface during a temperature increase by holding the heat homogenizing plate on a casing.

In the case where Y is defined as the outer diameter B of the heating element divided by the outer diameter C of the heat homogenizing plate, and X is defined as the thickness in mm of the heat homogenizing plate, the thickness X (mm) may be controlled to be in a range: $2 \leq X \leq 8$ and Y is within a range satisfying the following inequalities:

$Y \geq 0.02X + 0.7;$ $Y \geq -0.02X + 0.9;$ $Y < -0.02X + 1.08;$ and $Y \leq 0.96$ In the case of satisfying these relations, the temperature distribution on the entire wafer can be suppressed to 10° C. or lower during increasing the temperature of a wafer newly substituted on the heat homogenizing plate, and also the lifetimes of the heating element can be prolonged.

Further, the heat homogenizing plate of the present invention, which may be equipped with a plurality of supporting pins in the mounting face for supporting the wafer over, and apart from, the mounting surface, preferably may have 0.8 or higher of emissivity ε to infrared rays of 8 μm wavelength at 100° C. or higher temperature.

The heat homogenizing plate may have the supporting pins of 0.05 to 0.5 mm in height projected above the mounting face. Thus, by optimizing the heat radiation from the heat homogenizing plate, the temperature distribution in the wafer can be made more uniform through heat conduction from the supporting pins and heat radiation from the mounting face in combination.

BRIEF DESCRIPTION OF THE DRAWINGS

The present invention will be described below in detail with reference to the accompanying drawings as follows.

DESCRIPTION OF THE PREFERRED EMBODIMENTS

Figure 1:
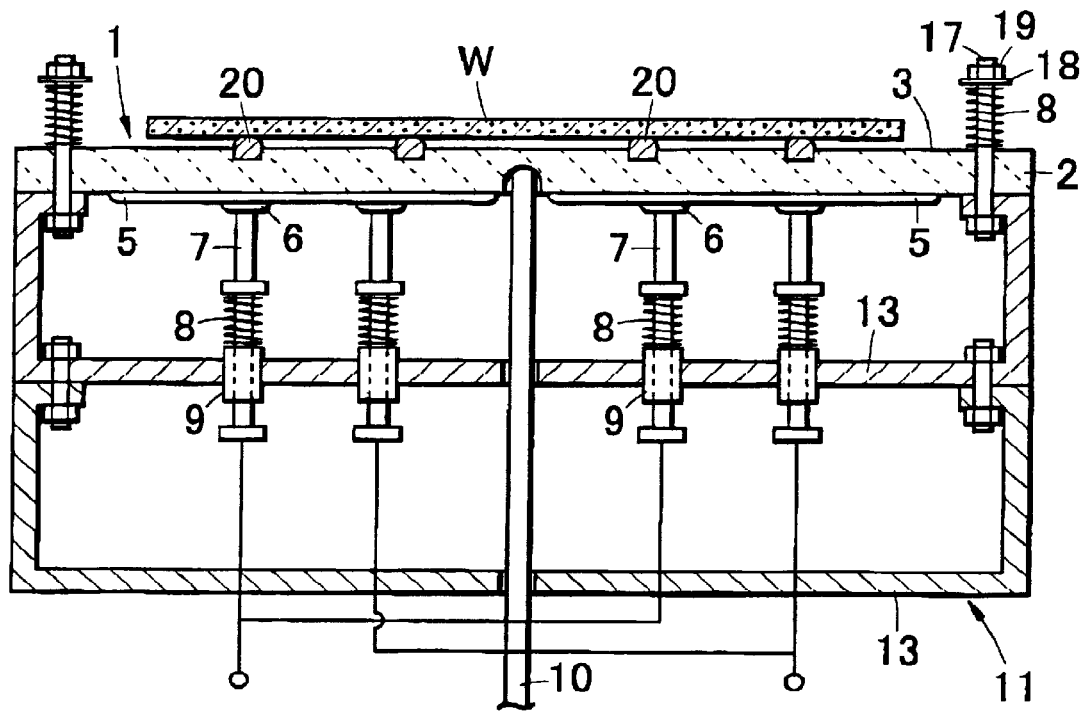
FIG. 1 shows a cross-sectional view of a wafer heating apparatus according to one embodiment of the present invention.

A wafer heating apparatus of one embodiment of the present invention, as illustrated in FIG. 1, includes a heat homogenizing plate 2 of a ceramic plate having a mounting face 3 for mounting a wafer W in one main face, a heating element 5 formed in the other main face or in the side of the heat homogenizing plate and an electric supply portion 6 formed in the other main face and electrically connected with the heating element 5.

The heat homogenizing plate is made of a ceramic and formed into a disk and the heating element is formed in the inside of the heat homogenizing plate or in the main face opposed to the mounting face. The heating element is composed of patterned thin resistor strips.

A pattern of the strips of the heating element is either a simple spiral or combinations of a large number of arc-like segments 5a and folded back portions 5b. Another pattern may be formed by concentrically arranging a plurality of separate blocks each composed by dividing the combination of the arc-like segments 5a and the folded back portions 5b or arranging two or more blocks symmetric in an axis.

Figure 2:
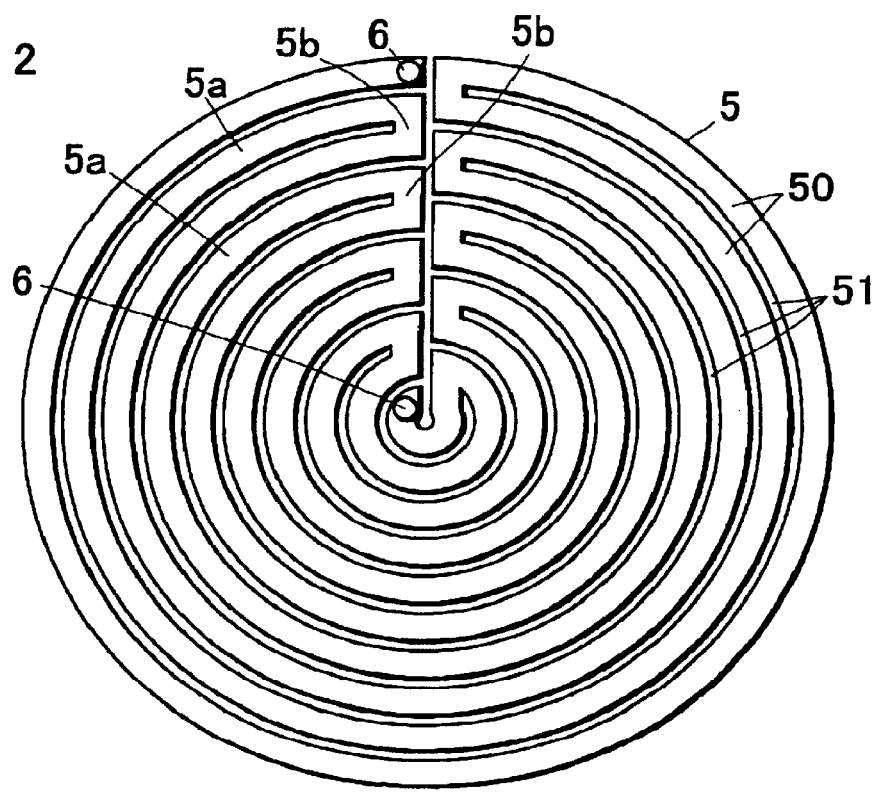
FIG. 2 shows a plan view of a heat homogenizing plate showing the arrangement of the patterned resistor strips constituting a heating element of a wafer heating apparatus of the present invention.
Figure 3:
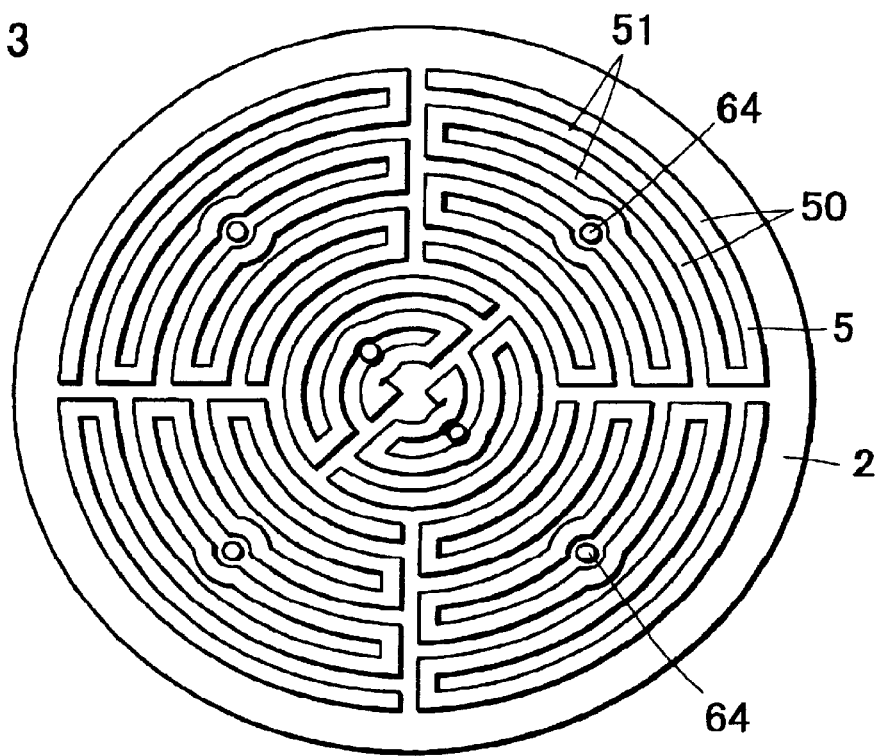
FIG. 3 shows a view similarly to FIG. 2 showing another embodiment of the resistor strips of a healing element of a wafer heating apparatus of the present invention.

FIG. 2 shows an embodiment of the arrangement of the resistor strips of combination of arc-like segments 5a and folded back portions 5b. FIG. 3 shows an arrangement of a plurality of blocks each of which is composed of a large number of segments 5a and folding back portions 5b connecting the end parts of the neighboring segments.

The resistor strips are connected to the electric supply portion and generate heat by electric current supply and heat the heat homogenizing plate. In the case the heating element 5 is divided into a plurality of blocks, each block composes a single resistance circuit of the resistor strips and the electric current application to the respective blocks is controlled separately. That makes independent temperature control possible for every block and even heating of the mounting face 3 possible.

Figure 4:
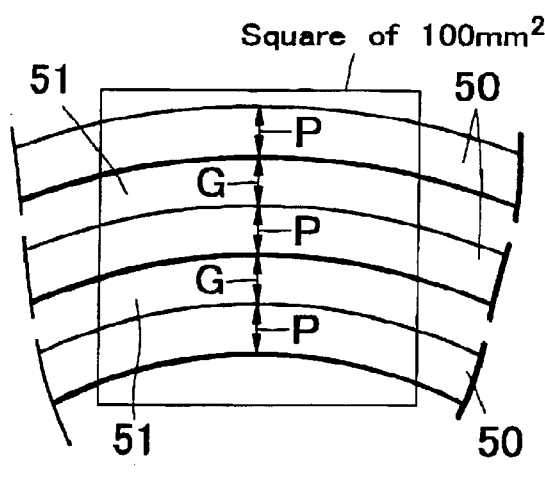
FIGS. 4A and 4B show the arrangement of resistor strips in an optional portion of a 10 mm square in a wafer heating apparatus of the present invention.
Figure 4:
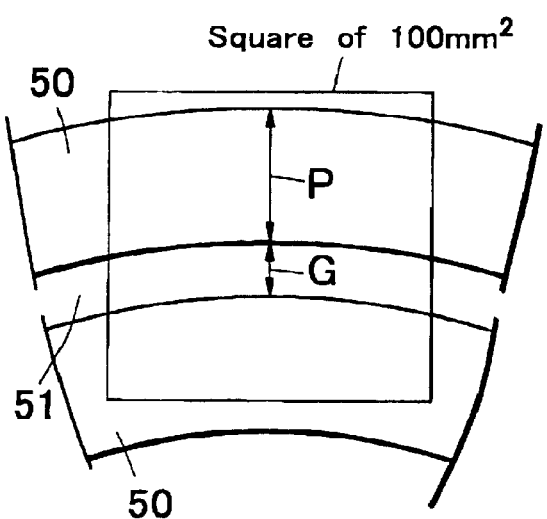
Figure 5:
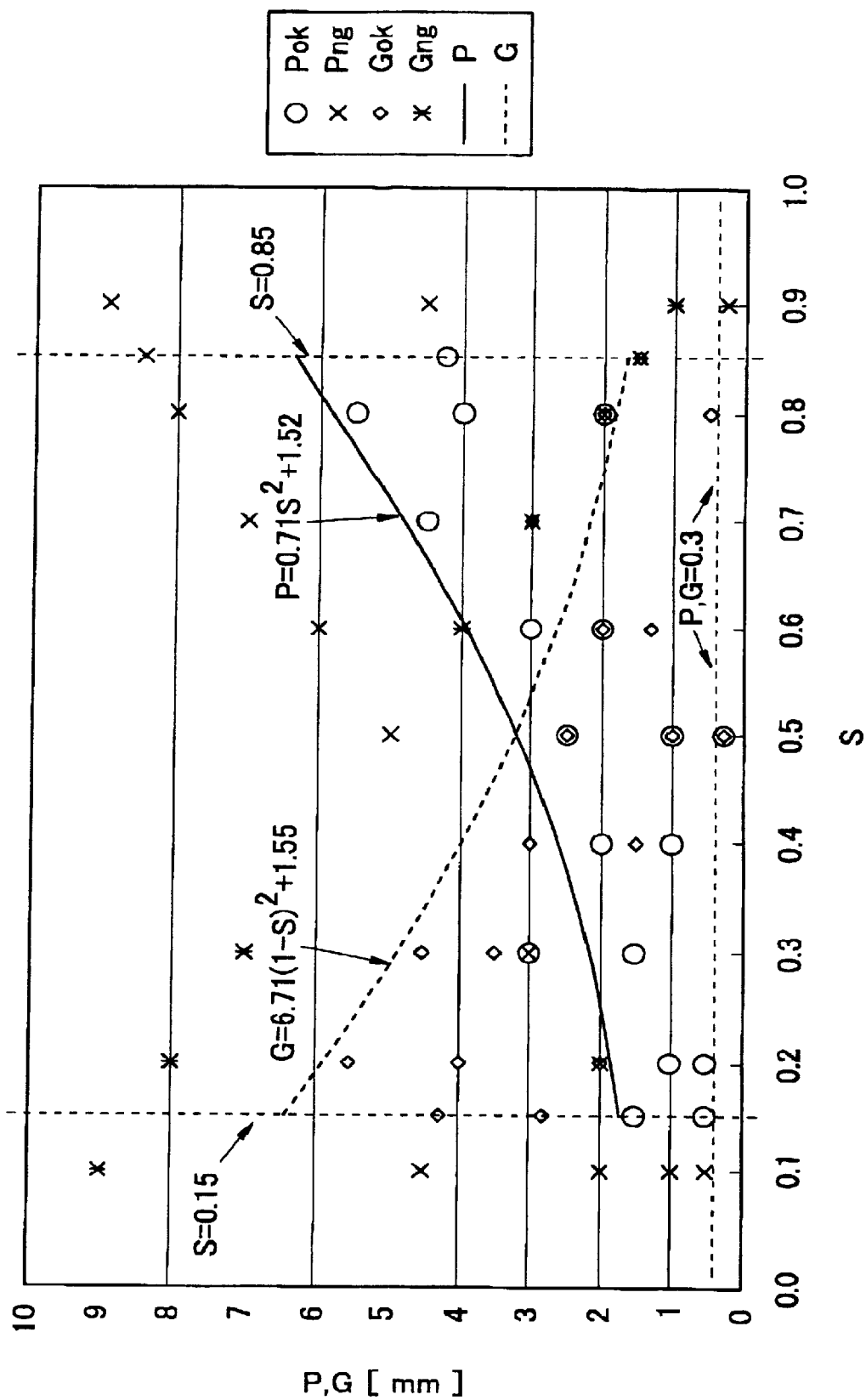
FIG. 5 shows a graph showing the relations of the surface ratio S of the heating element with the width P and gap G in a wafer heating apparatus.

FIG. 4A and FIG. 4B show a portion of the arrangement of the resistor strips formed in the rear face of the heat homogenizing plate 2. In an optional portion of 10 mm square, a plurality of resistor strips 50 and gaps 51 between neighboring resistor strips 50, 50. These illustrations define the width P of the resistor strips 50 and the width G of the gap 51 between neighboring resistor strips 50, 50.

In the present invention, the surface area S1 of the heating element 5 is the total of the surface area of all of the strips 50 contained in an optional portion of 10 mm square. FIG. 4A shows an example including only a single heating element 5 and a single gap in an optional portion of 10 mm square and as illustrated, the width completely including the width of resistor strips 50 is defined as P and the gap completely including the gaps between the neighboring strips 50, 50 is defined as G. In this case, the surface area S1 of the heating element 5 also means the total surface areas of all of the resistor strips 50 contained in the square region of optional 10 mm square.

In the case there are folded back parts and bent parts of the patterns in the region in an optional portion of 10 mm square, the width P of the strips 5 and the width G of the gap 51 are defined as the width in the vertical direction to the current flow in the heating element 5. In the case the width of the strips or the gap is changed in an optional portion of 10 mm square, the width calculated by averaging the maximum width and the minimum width is defined as P and G.

An optional portion of 10 mm square can be selected from the region where the heating element 5 is installed. The surface area and the width of five regions adjacent to one another are measured and S1, P, and G can be measured based on their average values.

The resistor strips 50 of the heating element 5 of the present invention are so arranged as to satisfy the following:

$0.15 \leq S \leq 0.85$, $0.3 \leq P \leq 6.71 \times S^2 + 1.52$, and $0.3 \leq G \leq 6.71 \times (1-S)^2 + 1.55$:

in the case the surface area ratio S of resistor strips in an optional portion of 10 mm square of an effective heat generation area where the heating element is installed is defined as $S = S1/100$ mm$^2$, wherein the reference character S1 (mm$^2$) denotes the surface area of the heating element in an optional portion of 10 mm square: the width of the heat generating patterns is defined as P (mm): and the gap between neighboring heat generating patterns is defined as G (mm).

If the heating element 5 is arranged in the above-described conditions, the temperature dispersion of the wafer can be suppressed to 0.5° C.

If S is smaller than 0.15, the surface area of the portions where the resistor strips 5 generates heat is too small to sufficiently heat gaps 51 where heating is not carried out, resulting in a wide temperature dispersion.

If S exceeds 0.85, the portion where the resistor strips generate heat is too wide and the gaps 51 are narrowed and accordingly the electric current is short-circuited in the folded back portions 5b of the strips 50 and a large quantity of heat is locally generated. That widens the temperature dispersion.

Even if S is in the range; $0.15 \leq S \leq 0.85$; in the case P exceeds the above-described inequality, the above-described state appears in the folded back portions of the patterns to result in a wide temperature dispersion. If P is smaller than 0.3 mm, the thickness in micro-order can not be stabilized in the case patterned resistor strips are formed by screen printing or the like to result in decrease of the reliability as the heating element and therefore, it is not preferable. If G is less than 0.3 mm, owing to control of a plurality of resistance circuits, the withstand voltage among the circuits sometimes does not satisfy 1.5 kV and therefore it is not preferable.

On the other hand, if the width G of the gap exceeds the above-described inequality, the gap becomes to wide and some portion of the heat homogenizing plate cannot sufficiently be heated to result in a wide temperature dispersion in the heat homogenizing plate.

Regarding the shape of the heat homogenizing plate, the thickness of the 2 is preferable to be 1 to 8 mm. The heat homogenizing plate with a thickness thinner than 1 mm, the heat from the patterned strips cannot sufficiently be diffused in terms of temperature distribution. Accordingly the temperature dispersion is widened. The thickness is preferably adjusted to be 2 mm or thicker. On the other hand, in the case of the heat homogenizing plate with a thickness exceeding 8 mm, the plate takes a long time to respond to the temperature setting alteration and cooling, resulting in treatment efficiency decrease.

In the case the thickness X (mm) is in a range; $2 \leq X < 8$; and preferably in the case Y is defined as the ratio of the outer diameter B of the heating element to the outer diameter C of the heat homogenizing plate the heating element satisfies all the following inequalities:

$Y \geq 0.02X + 0.7$, $Y \geq -0.02X + 0.9$, $Y < -0.02X + 1.08$, and $Y \leq 0.96$.

If the thickness X of the heat homogenizing plate 2 is thinner than 2 mm, the temperature dispersion at the steady time and the transition time is widened and if $Y < -0.02X + 0.9$, $Y < 0.02X + 0.7$, and $Y > -0.02X + 1.08$, the transition temperature dispersion is widened. Also, if Y exceeds 0.96, the life owing to heating and cooling cycles is considerably shortened and therefore it is not preferable.

Evenly Heating Plate

Figure 8:
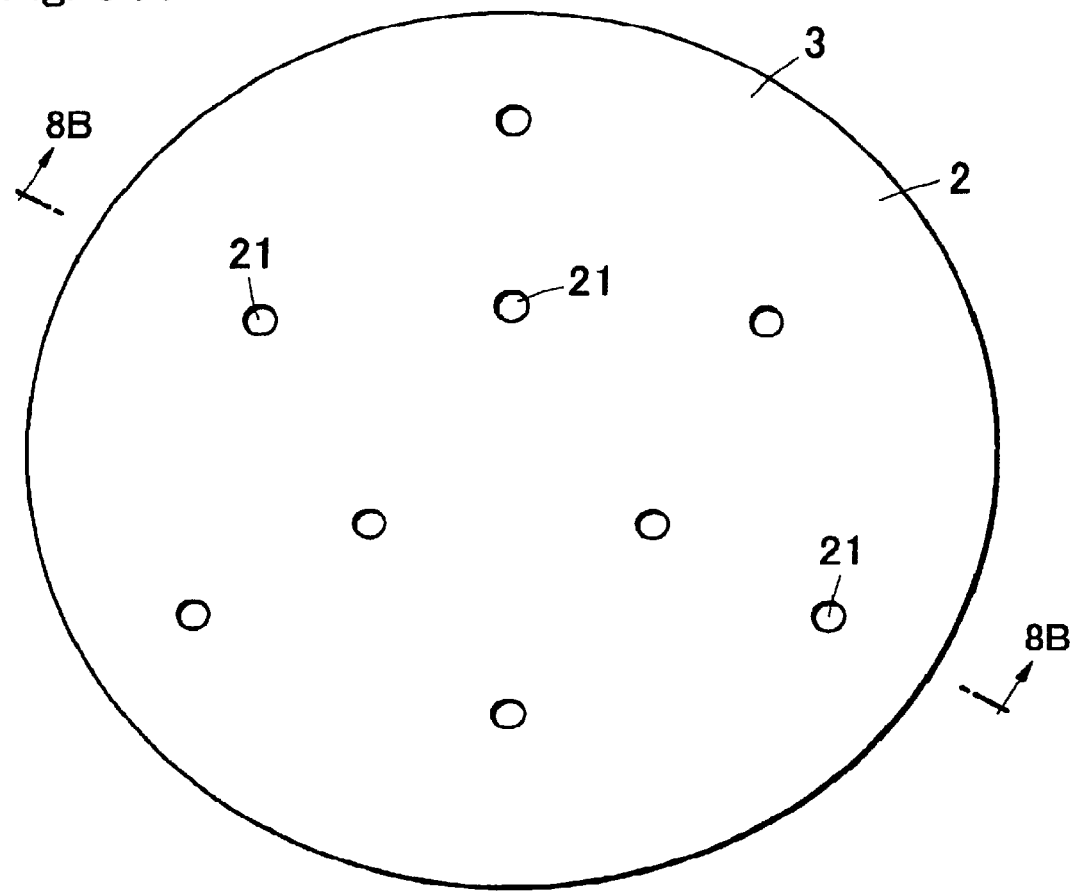
FIGS. 8A and 8B respectively show a front view and a cross-sectional view of a heat homogenizing plate to be employed for a heating apparatus of the present invention.
Figure 8:
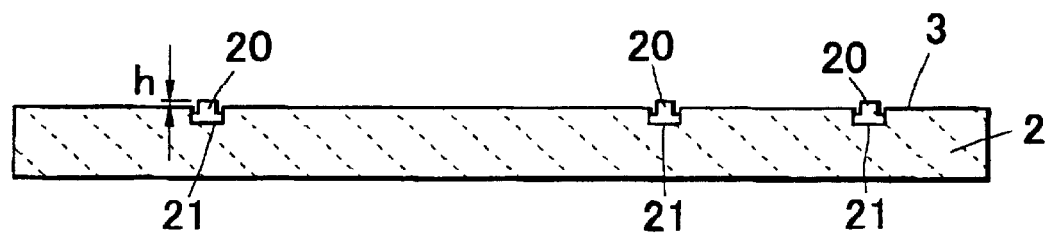

One embodiment of the shape of the heat homogenizing plate 2 is shown in FIGS. 8A, 8B, and the heat homogenizing plate 2 has a disk-like shape with a prescribed thickness. The ceramic material composing the heat homogenizing plate 2 includes ceramic sintered bodies of silicon carbide, boron carbide, boron nitride, silicon nitride, alumina, aluminum nitride and the like.

In the case the thickness is 2 to 8 mm as described above, the heat homogenizing plate 2 is preferable to have a thermal conductivity of exceeding 80 W/m·K in order to obtain effective heat diffusion.

The heat homogenizing plate is preferable to have infrared emissivity of 0.8 or higher for infrared rays of 8 µm wavelength at 100° C. or higher. Especially, in the case the wafer is mounted on the mounting face through supporting pins, the emissivity is preferably 0.8 or higher as described above. Accordingly, the wafer W is heated mostly by radiation heat from the heat homogenizing plate 2 other then the heat conduction through the supporting pins. The heat absorption of a semiconductor wafer W of silicon or the like becomes the maximum for the infrared rays with wavelength of about 8 µm and since the infrared emissivity of the heat homogenizing plate 2 in such a wavelength region is set to be 0.8 or higher, heating efficiency of the wafer W can be increased. Since the infrared ray absorptivity of the wafer W depends on the wavelength spectra of the infrared rays emitted from the heat homogenizing plate 2, a heat source, it is preferable to heat the wafer W by radiation in a wavelength band in which the heat absorption efficiency is highest. Since the heat homogenizing plate 2 is generally used while being heated to 100° C. or higher, the infrared emissivity is adjusted to be 0.8 or higher at a temperature of 100° C. or higher.

From this viewpoint, it is not preferable to use a metal plate having a metallic luster for the heat homogenizing plate. For example, although a plate of metal tungsten W and nickel Ni radiates light with wavelength of 3 µm or shorter at which the maximum emissivity can be obtained but the emissivity of infrared rays with 8 µm or longer wavelength is extremely low as 0.1 or lower. The light rays with wavelength of 3 µm are almost all transmitted through the silicon wafer W, so that the heat efficiency is lowered and the wafer cannot be heated sufficiently. Accordingly, it is not desirable to produce or coat the heat homogenizing plate 2 from or with the above-described metals.

To practically ensure the above-described emissivity of the heat homogenizing plate, the hue of the ceramic is preferable to be black. As the degree of the blacking, the lightness of the heat homogenizing plate 2 is decreased to lightness N3 or lower, which is defined in JIS Z8721, By blackening the heat homogenizing plate to lower the lightness to N3 or lower, the emissivity of the infrared rays including the above-described wavelength 8 µm band can be increased.

In order to blacken the surface, carbon may be added to the ceramic. Generally, the ceramic of such as alumina, aluminum nitride is white or gray having lightness as high as N5 or higher and the emissivity is low, however addition of carbon in the surface layer makes it possible to obtain emissivity of 0.7 or higher in the above-described wavelength band of about 8 μm. If the ceramic is fired in an environment containing a large amount of carbon during the sintering process by a hot press or HIP and the like, the lightness can be suppressed to low and the infrared emissivity can be increased.

In the case of another heat homogenizing plate the heat homogenizing plate having a high lightness may be blackened by being coated with a material with low lightness. The heat homogenizing plate 2 of a ceramic may be coated with a blackening material such as TiC, AlTiC, DLC and the like in a thickness of several micrometers by vacuum evaporation such as CVD, PVD.

For the heat homogenizing plate 2 to be blackened as described above, a sintered body containing alumina, aluminum nitride, silicon carbide, silicon nitride, boron nitride and the like can be use.

Further, since supporting pins 20 are used for supporting the wafer, the supporting pins interrupt the radiation heat from the heat homogenizing plate to the wafer W, however optimized adjustment of the projection height h of the supporting pins 20 from the mounting face 3 and the diameter of the supporting pins makes heat conduction from the supporting pins 20 possible in place of the radiation heat.

The flatness in the mounting face 3 of the heat homogenizing plate 2 is preferably 100 μm or lower, further preferably 50 μm or lower. By holding the heat homogenizing plate 2 elastically on a support 11, the warp caused by temperature distribution in the support 11 can be moderated by the elastic structure, so that the flatness of the heat homogenizing plate 2 can be maintained.

Regarding the smoothness of the mounting face 3 of the heat homogenizing plate 2, since the smoothly polished mirror face increases the reflectance, the emissivity is contrary decreased. In order to increase the above-described emissivity, the mounting face of the heat homogenizing plate is preferable to have the surface roughness Ra of 0.8 μm or higher, whereas the surface roughness Ra exceeding 3.2 μm makes the surface washing difficult. It is made possible to suppress infrared reflectance and increase the infrared emissivity by adjusting the smoothness of the surface of the mounting face in a range of the surface roughness Ra from 0.8 to 3.2 μm.

On the other hand, since heating element 5 or an insulating layer 4 composed of glass or resin is to be attached to the main face on the reverse side of the mounting face 3 of the heat homogenizing plate 2, in order to increase their adhesion to the main face, the surface is preferably adjusted to have the flatness of 20 μm or lower and the surface roughness (Ra) as the center line average roughness in a range from 0.1 μm to 0.5 μm.

Supporting Pin

As shown in FIG. 1, FIG. 7, and FIGS. 8A and 8B, in order to mount the wafer W on the mounting face 3 of the heat homogenizing plate 2 while being parted from the mounting face, a plurality of pins 20 for supporting are so arranged in the disk-like heat homogenizing plate 2 as to be projected in the tip parts. The projected tip ends of the supporting pins 20 support the lower face of the wafer W and fix the wafer W.

The distance from the mounting face 3 to the lower face of the wafer W can be set by the height of the supporting pins 20. The projection height of the supporting pins 20 is preferably 0.05 to 0.5 mm on the bases of the mounting face 3 of the wafer. If the height of the supporting pins is 0.05 mm or lower, the wafer is partially brought into contact with the heat homogenizing plate owing to the warping and accordingly, the temperature distribution in the wafer W is widely dispersed. Also, in the case of the supporting pin height of 0.05 m or lower, owing to the radiation heat from the heat homogenizing plate, local heating of the wafer takes place to result in wide dispersion of the temperature distribution. On the other hand, if the distance exceeds 0.5 mm, the heat transfer to a newly replaced wafer is decreased to deteriorate the temperature response and therefore it undesirably takes a long time to increase the temperature to a prescribed temperature.

The diameter of such supporting pins is preferably 2 to 10 mm. The contact surface area of the supporting pins with the wafer is preferably 10 $mm^2$ per every one supporting pin or narrower to suppress thermal effect of the supporting pins on the wafer W.

Structure of Supporting Pin

Figure 9:
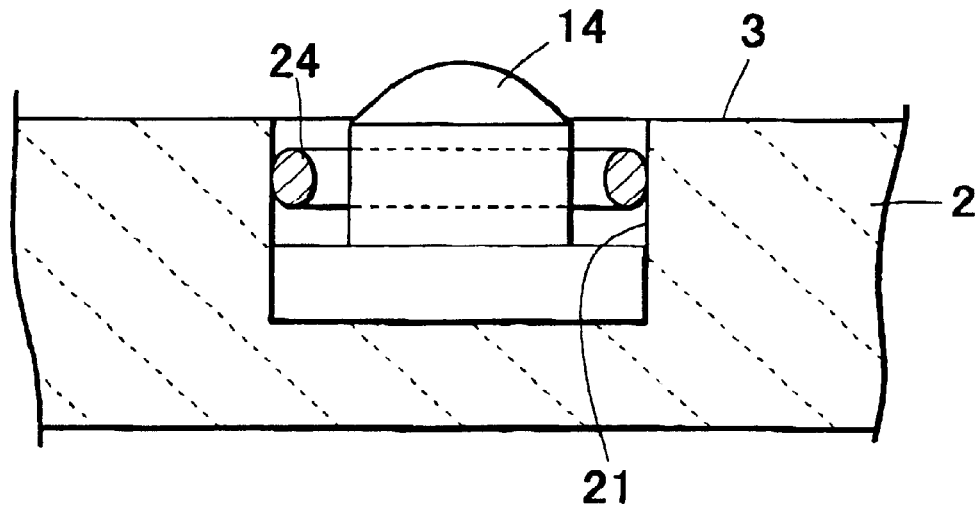
FIGS. 9A and 9B show partial cross-sectional views of a heat homogenizing plate including a supporting pin.
Figure 9:
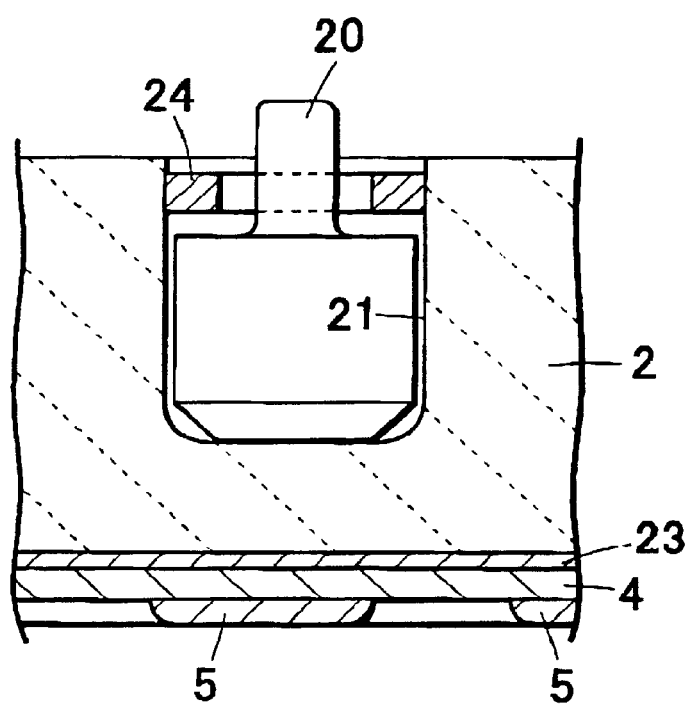

One embodiment of the structure of the supporting pins 20 is shown in FIGS. 9A, 9B, however the supporting pins 20 is not joined to recessed parts 21 but simply put there. In that case, in order to prevent the supporting pins from coming off, fixing rings 24 are set in the upper parts of the recessed parts 21. The fixing rings 24 may not be brought into contact with the supporting pins 20. Such fixing rings 24 may be snap rings to be engaged in the inner faces of the recessed parts 21. The fixing rings 24 are made of a heat resistant metal such as Ni, SUS 316, SUS 631, 42 Alloy, Inconel Incoloy.

Heating Element

The heating element 5 has a circular region formed by arranging resistor strips 50 in the appearance and is preferable to have the outer diameter of the region in a relative relation with the wafer in order to evenly heat the wafer to be mounted thereon. The outer diameter B is preferably in a range from 1.075 to 1.30 times as large as the outer diameter of the wafer to be mounted on the heat homogenizing plate. The outer diameter of the region of the heating element 5 means the diameter of the circle defined by a single resistor strip in the, outermost side of the heating element 5 or two or more divided resistor strips in the outermost side. In the case the heating element 5 has the outer diameter less than 1.075 times as large as the outer diameter of the wafer W, owing to the heat release from the outer circumferential part of the heat homogenizing plate the temperature in the outer circumferential part is lower than in the center part and the entire temperature dispersion is widened and the temperature dispersion sometimes exceeds 10° C. On the contrary, in the case of exceeding 1.30 times, the heating element 5 does not improve the evenly heating property and in addition to that, the cost of the heat homogenizing plate is increased, the power consumption becomes high, and the cost of the apparatus itself is increased, and it is not preferably. In the case the diameter is within the range from 1.075 to 1.30 times, it is made possible to suppress the temperature dispersion to 1° C. or lower during the steady heating and to 10° C. or lower during the transition heating in the entire area of the wafer of the size from 8 inches to 12 inches and suppress the power consumption to 300 W or lower. The outer diameter B of the heating element is preferably in a range from 1.02 to 1.20 times as large as the outer diameter of the wafer.

On the other hand, the heating element 5 is preferable to use a sintered body produced by printing a paste of a resistor powder on the ceramic surface in resistor strip patterns and then firing the paste.

Figure 6:
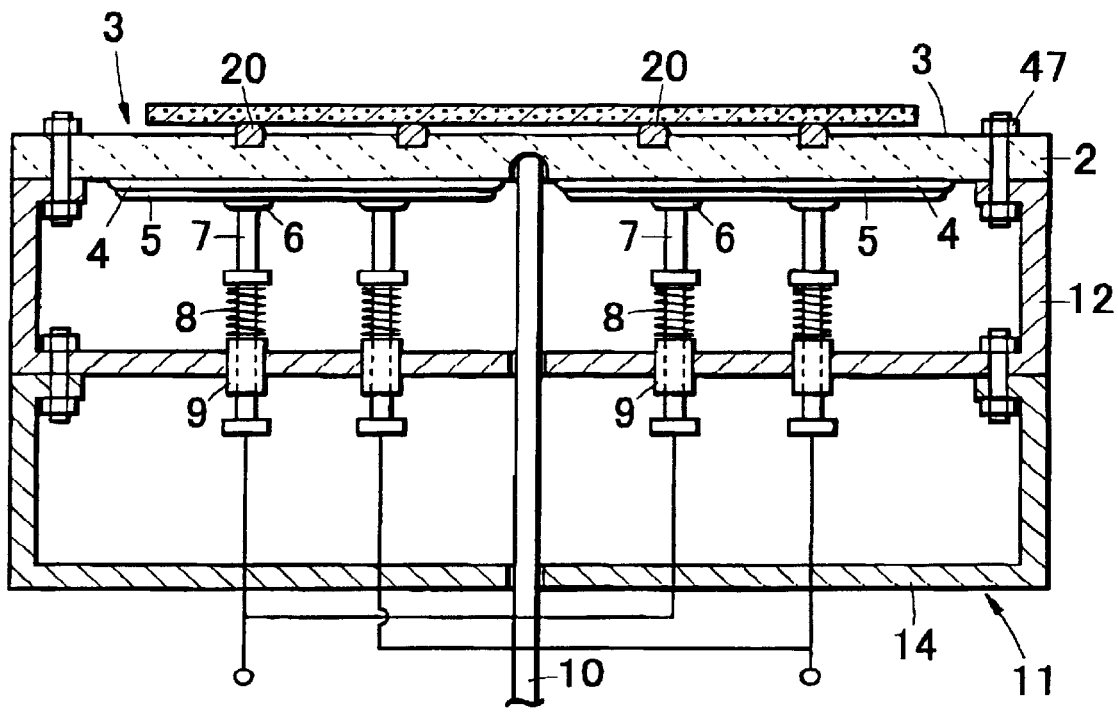
FIG. 6 shows a view similarly to FIG. 1 of a wafer heating apparatus according to another embodiment of the present invention.

If the ceramic shows semiconductive properties, the resistor strips are preferable to be formed on the insulating layer 4 formed on the ceramic surface. FIG. 6 shows an example of a heating apparatus in which the insulating layer 4 is formed between the heating element 5 composed of the resistor strips and the rear face of the heat homogenizing plate 2.

The resistor strips composing the heating element 5 may contain, as a conductive component, preferably a heat resistant and oxidation resistant metal such as noble metals, e.g., copper (Cu), silver (Ag), gold (Au); platinum-group metals, e.g., platinum (Pt), palladium (Pd); their alloys. A single element of these metals and alloys may directly be deposited by a deposition method and a plating method. Another type of the resistor strips maybe formed by producing a resin paste or glass paste containing the above-described metal element and further an oxide such as rhenium oxide $Re_2O_3$, lanthanum oxide $LaMnO_3$ and the like as a conductive material, applying the paste, and burning the past. The glass component in the resistor strips is preferably in a range from 30 to 75% by weight. The glass component improves the adhesion strength to the insulating layer 4 and the sintering property of the heating element 5 itself. The resistor strips may also contain an insulating inorganic material, which is to be added for adjustment of the specific resistance.

The resistance temperature coefficient (that is, the alteration ratio of the electric resistance depending on the temperature change) of the heating element 5 is preferable to be $3,000\times10^{-6}/°$ C. or lower. If the resistance temperature coefficient is too high, the resistance value at an ordinary temperature becomes low and the electric power supply at the time of starting power application is increased and a temperature control circuit for controlling the initial power becomes costly to increase the apparatus cost. Hence, the resistance temperature coefficient of the heating element 5 is adjusted to be $3,000\times10^{-6}/°$ C. to increase the resistance value at an ordinary temperature, so that the rush current can be suppressed and the load of the control circuit can be lowered.

To suppress the resistance temperature coefficient of the heating element 5 to $3,000\times10^{-6}/°$ C., for example, Au and a platinum-group metal may be alloyed. In the case of Pt, the mixing ratio (Au:Pt) for the alloying may be controlled in a range from 5:95 to 95:5.

The resistor strips formed by such a manner tend to cause the thickness dispersion in micro-level and the spatial alteration of the thickness gives small change in the resistance density per unit length of the strips. Therefore, if necessary, the width or the thickness of the resistor strips may be trimmed by laser trimming process to make the above-described resistance density even. That is, the temperature distribution can precisely be adjusted.

Further, in such a wafer heating apparatus, as shown in FIG. 1, the above-described heat homogenizing plate 2 bearing the heating element 5 is joined to the upper rim part of a case-like support 11 and an electric communication terminal 7 arranged in the inside of the support is connected to the electric supply portion 6.

Figure 7:
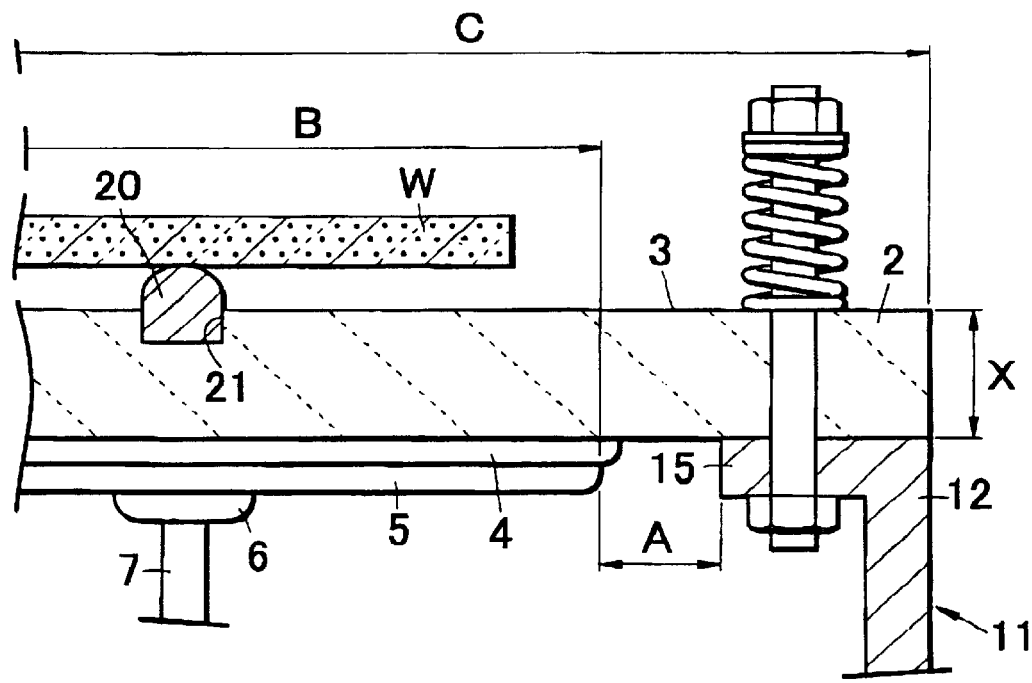
FIG. 7 shows a magnified figure of a part including a heat homogenizing plate and a support of the wafer heating apparatus shown in FIG. 6.

The heat homogenizing plate 2, as shown in FIG. 1, FIG. 6 and FIG. 7, is fixed in the upper rim part of the support 11. The support has a bottomed-cylindrical shape and the heat homogenizing plate 2 is to be disposed in the upper part opening while the mounting face 3 being set upward.

The support is made of a metal with an upper part opened cylindrical shape and the heat homogenizing plate 2 is so set on the upper rim part as to cover the opening part of the support 11. The support 11 made of a metal includes a side wall portion and an isolation plate 13 with a mono- or multi-layer structure. In this embodiment, in the isolation plate 13, the electric communication terminal 7 for electric connection with the electric supply portion 6 for supplying electric power to the heating element 5 of the heat homogenizing plate 2 is installed in the isolation plate 13 through a sliding insulating member 9 and pushed against the electric supply portion 6 in the surface of the heat homogenizing plate 2 by an elastic body 8.

In details, as shown in FIG. 7, the support 11 supports and fixes the circumferential rim of the heat homogenizing plate 2 on a heat homogenizing plate holding part 14 forming a flange in the inside of the upper side opening. In such an arrangement, the outer rim of the heating element 5 is so arranged as to keep the distance A to the inner rim of the heat homogenizing plate holding part 14 be 2 mm or wider. If the distance A between the inner rim of the heat homogenizing plate holding part 14 of the support 11 and the heating element 5 is narrower than 2 mm, thermal stress is caused in the heat homogenizing plate 2 owing to the heat transfer from the heat homogenizing plate to the heat homogenizing plate holding part to considerably shorten the life of the heating element 5.

Preferably the outer diameter B of the heating element 5 is wider than the outer diameter of the wafer possible to be treated by 5 mm or more. If the difference of the diameter between the heating element 5 and the wafer W is less than 5 mm, the temperature distribution of the wafer W is changed significantly.

In this embodiment, the electric communication terminal 7 is formed like an axis and guided and supported while penetrating the sliding insulating member 9 fixed in the isolation plate 13 in the transverse direction in the inside of the support. The electric communication terminal 7 is elastically energized so as to be pushed upward by the fixed elastic body 8 from the sliding insulating member 9 and the end face of the electric communication terminal 7 is constantly brought into contact with the surface of the electric supply portion 6 or a pad electrode. Accordingly even if expansion difference is caused owing to the temperature difference between the heat homogenizing plate 2 and the support 11, the contact portion between the end face of the electric communication terminal and the pad electrode slides, so that the contact between the terminal and the electrode can be ensured in the wafer heating apparatus of this embodiment. As a result, the wafer heating apparatus is made capable of sufficiently responding to the size alteration attributed to the heat cycle during the use and dealing with the matter.

For the elastic body 8, a helical or a plate type spring as shown in FIG. 1 may be used to give an upward energizing structure. The elastic body 8 is preferable to apply a load of 0.3 N or higher to the electric communication terminal 7 to the support. Since the elastic body pushes the electric communication terminal 7 with the above-described load against the electric supply portion 6 from the lower face of the heat homogenizing plate 2, the elastic body can prevent the electric communication terminal 7 from parting from the electric supply portion 6 owing to the friction with the sliding insulating member 9 of the electric communication terminal 7. Responding to the size change of the heat homogenizing plate 2 and the support 11 owing to the expansion and contraction, the electric communication terminal 7 follows the change to ensure the contact with the electric supply portion.

The diameter of the electric communication terminal 7 in the side contacting with the electric supply portion 6 is preferably 1.5 to 4 mm. Further, for the sliding insulating member 9 for holding the electric communication terminal 7, PEEK [poly(ethoxy ethoxy ketone) resin] material containing glass fiber dispersed therein may be used depending on the use temperature, for example, a temperature of 200° C. or lower and in the case of using at a temperature higher than that, the sliding insulating member 9 made or a ceramic such as alumina, mullite and the like, may be employed.

At least the contact portion of the electric communication terminal 7 contacting with the electric supply portion 6 is preferably made of one or more metals selected from Ni, Cr, Ag, Au, a stainless steel and platinum-group metals. Further, by inserting a metal foil of the above-described metals between the electric communication terminal 7 and the electric supply portion 6, the contact failure owing to oxidation of the surface of the electric communication terminal 7 can be prevented, resulting in improvement of the durability of the heat homogenizing plate 2. More practically, if a metal foil 16 of one or more metals selected from Ni, Cr, Ag, Au, a stainless steel and platinum-group metals is inserted between the above-described electric supply portion 6 and electric communication terminal 7, the reliability of the electric contact is increased and simultaneously, the size difference attributed to the temperature difference between the heat homogenizing plate 2 and the support 11 can be moderated by the slide on the metal foil.

Further, if the surface of the electric communication terminal 7 is processed by plating or sand blast processing to be roughened, the contact is prevented from becoming point contact and accordingly the reliability of the contact can be improved.

A thermocouple 10 is installed in the vicinity of the wafer-mounting face 3 in the center part of the heat homogenizing plate 2 so as to adjust the temperature of the heat homogenizing plate 2 based on the temperature of the thermocouple 10. In the case the heating element 5 is divided into a plurality of blocks and the temperature control is separately carried out, the thermocouple 10 for measuring the temperature of a block is installed in every block of the heating element 5.

The heat homogenizing plate may have a gas jetting port (not illustrated in the figure) for cooling the heat homogenizing plate 2 and an opening for gas discharge. As described, by forming a cooling mechanism of the heat homogenizing plate 2, the tact time for the semiconductor film and resist film formation or the surface etching work can be shortened.

The isolation plate 13 with two or more layers is preferable to be installed for holding the heat homogenizing plate in an even temperature and a single layer isolation plate is not preferable since it takes a long time to have an even temperature. The uppermost layer of the isolation plate 13 is desirable to be at a distance of 5 to 15 mm from the heat homogenizing plate 2. Therefore, it is made easy to carry out even heating by radiation heat between the heat homogenizing plate 2 and the plate-like structure 13 and owing to the heat insulation effect from other layers, the time taken to reach even heating can be shortened. At the time of cooling, the gas receiving the heat of the surface of the heat homogenizing plate 2 is successively discharged to the outside through the gas discharge port 12 and newly introduced cooling gas can cool the heat homogenizing plate 2, so that the cooling time can be shortened.

Ceramic Material

Regarding the material of the heat homogenizing plate 2, it is preferable to use a sintered body of such as silicon carbide, boron carbide, boron nitride, aluminum nitride or silicon nitride to form the heat homogenizing plate 2 and the ceramic sintered body can be made thin to about 2 to 8 mm thickness since it is scarcely deformed even by heating to a high temperature. The ceramic with a thickness in such a range can shorten the heating time for increasing temperature to a prescribed treatment temperature and the cooling time for decreasing the prescribed treatment temperature to an approximately room temperature to result in increase of productivity.

In order to produce the heat homogenizing plate 2, a silicon carbide-based-sintered body can be produced as following manner; adding boron (B) and carbon (C) or an oxide including alumina ($Al_2O_3$), yttria ($Y_2O_3$) or the like as a sintering aid to silicon carbide, a main component, sufficiently mixing the mixture, and forming the mixture in a flat plate by press molding, and firing the resulting compact at 1,900 to 2,100° C. to be a sintered body. Both α-type and β-type of silicon carbide may be used.

A boron carbide-based sintered body can be produced by adding 3 to 10% by weight of carbon C as a sintering aid to boron carbide, a main component, and hot press firing the mixture at 2,000 to 2,200° C. to be a sintered body.

A boron nitride-based sintered body can be produced by adding 30 to 45% by weight of aluminum nitride and 5 to 10% by weight of rare earth oxide as sintering aids to boron nitride, a main component, and hot press firing the mixture at 1,900 to 2,100° C. to be a sintered body. There is another method for obtaining a sintered body of boron nitride by adding borosilicate glass and sintering a raw material mixture, however in this case, the thermal conductivity is significantly decreased and therefore, it is not preferable.

Further, an aluminum nitride-based sintered body for producing the heat homogenizing plate 2 can be produced by adding a rare earth oxide such as $Y_2O_3$, $Yb_2O_3$ and the like as a sintering aid and an alkaline earth metal such as CaO based on the necessity to aluminum nitride, a main component, sufficiently mixing the additives with the aluminum nitride, forming the mixture in a flat shape, and firing the obtained compact at 1,900 to 2,100° C. in nitrogen gas to be a sintered body.

Further, a boron carbide-based sintered body can be produced by adding 3 to 10% by weight of carbon as a sintering aid to boron carbide, a main component, and hot press firing the mixture at 2,100 to 2,200° C. to be a sintered body.

Further, a silicon nitride-based sintered body for producing the heat homogenizing plate 2 can be produced by adding 3 to 12% by weight of a rare earth oxide, 0.5 to 3% by weight of $Al_2O_3$, and $SiO_2$ in an amount to be 1.5 to 5% by weight in the resulting sintered body as sintering aids to silicon nitride, a main component, and hot press firing the obtained mixture at 1,650 to 1,750° C. to be a sintered body. The amount of $SiO_2$ in this case means the total amount of $SiO_2$ produced from impurity oxide contained in the silicon nitride raw material, $SiO_2$ as impurities contained in other additives, and the $SiO_2$ intentionally added including that produced by ambient effects.

In the production process of the heat homogenizing plate from such materials, the pot press for sintering is carried out in carbon atmosphere to lower the ceramic lightness to at highest N3 standardized by JIS Z8721 and obtain a blackened ceramic disk usable for the heat homogenizing plate. The blackening hot press is ceramics with white or gray colors, such as alumina or aluminum nitride.

The temperature of the heat homogenizing plate 2 is measured by a thermocouple 10 whose tip part is buried in the heat homogenizing plate 2. From a viewpoint of the response and the holding workability, it is preferable to use a sheathed type thermocouple 10 with an outer diameter of 1.0 mm or smaller. The middle of the thermocouple 10 is held in the plate-like structure part 13 of the support so as not to apply force to the tip part buried in the heat homogenizing plate 2. The tip part of the thermocouple 10 is preferable to be pushed and held firmly in the inner wall face of a cylindrical metal body installed in a hole formed in the heat homogenizing plate 2 by a spring to improve the reliability of the temperature measurement.

Further, in the case of using the wafer heating apparatus 1 for forming a resist film, if a material containing a nitride as a main component is used for the heat homogenizing plate 2, it is probable to deteriorate the resist film by ammonia gas generated by reaction with moisture in atmospheric air. In such a case, materials of carbides such as silicon carbide, boron carbide and the like are preferable to be use for the heat homogenizing plate 2.

In the case it is probable to form ammonia or an amine by reaction of the nitride with water, it is required to make the ceramics practically free from nitrides. Accordingly, a fine wiring with a high density can be formed in the wafer W to be heated.

Further, from a viewpoint of improvement of the adhesion strength to the insulating layer 4 of glass or resin, the main face of the heat homogenizing plate 2 in the reverse side of the mounting face 3 is preferable to be polished as to have the flatness of 20 $\mu$m or lower and the surface roughness (Ra) of 0.1 $\mu$m to 0.5 $\mu$m on the basis of the center line average roughness.

Insulation Layer

As shown in FIG. 6 and FIG. 7, in the case a silicon carbide sintered body is used for the heat homogenizing plate 2, the sintered body has semiconductive properties, so that an insulating layer 4 is better to be interposed between the heat homogenizing plate 2 and the heating element 5 for keeping them electrically insulated from each other.

In the case glass is used, if the thickness is thinner than 100 $\mu$m, the withstand voltage is less than 1.5 kV and the insulation property cannot be maintained, whereas if the thickness exceeds 600 $\mu$m, the thermal expansion difference from that of the silicon carbide sintered body composing the heat homogenizing plate 2 becomes so high that cracks are formed and the insulating layer 4 cannot function well. Accordingly, in the case, glass is used for the insulating layer 4, the thickness of the insulating layer 4 is preferably in a range from 100 $\mu$m to 600 $\mu$m and further desirably in a range from 200 $\mu$m to 350 $\mu$m.

In the case a ceramic sintered body of mainly aluminum nitride is used for producing the heat homogenizing plate 2, in order to improve the adhesion strength of the heating element 5 to the heat homogenizing plate 2, the insulating layer 4 of glass is formed. However, in the case a sufficient amount of glass is added to the heating element 5 and accordingly a sufficient adhesion strength is obtained, the formation can be omitted.

The glass for forming the insulating layer 4 may be crystalline or amorphous. The glass is also required to have a heat resistant temperature of 200° C. or higher. Further, glass having a thermal expansion coefficient in a range from $-5 \times 10^{-7}$ to $+5 \times 10^{-7}$/° C. is selected in relation to the thermal expansion coefficient of the ceramic composing the heat homogenizing plate 2. That is because the glass which has a thermal expansion coefficient out of the above-described range has a wide thermal expansion difference from the ceramic forming the heat homogenizing plate 2 and easy to cause cracking and separation at the time of cooling after baking.

Next, in the case resin is used for the insulating layer 4, if the thickness is thinner than 30 $\mu$m, the withstand voltage is less than 1.5 kV and the insulation property cannot be maintained, and when the heating element 5 is trimmed by laser radiation, the lower layer, the insulating layer 4, is damaged to result in deterioration of the insulating function. Whereas, if the thickness exceeds 150 $\mu$m, at the time of baking resin, the evaporation of a solvent and water increases and bubbles are formed between the resin and the heat homogenizing plate 2 to result in partial separation and accordingly the separated portions decreases the heat transmission between the insulating layer and the heat homogenizing plate to inhibit even heating of the mounting face 3. Therefore, in the case resin is used for the insulating layer 4, the thickness of the insulating layer 4 is preferably in a range from 30 $\mu$m to 150 $\mu$m and more desirably in a range from 60 $\mu$m to 150 $\mu$m.

Further as the resin for the insulating layer 4, in consideration of the heat resistance of 200° C. or higher and the adhesion property to the heating element 5, polyimide resin, polyimide amide resin, polyamide resin are preferable to be contained.

The method for applying the insulating layer 4 of glass or resin to the heat homogenizing plate 2 may be carried out by dropping a proper amount of a glass paste or a resin paste for the insulating layer to the center part of the heat homogenizing plate 2 and spreading the paste by a spin coating method to coat the heat homogenizing plate 2 with the paste. The paste may also be applied evenly by a screen printing method, a dipping method, a spray coating method and the like. The evenly applied paste is then baked. The baking temperature is about 600 to 800° C. in the case of the glass paste and 300 to 400° C. in the case of the resin paste. In the case glass is used for the insulating layer 4, in order to increase the adhesion strength to the insulating layer 4 of glass, it is preferable to oxidize the main face of the heat homogenizing plate 2 to be coated with the insulating layer 4 by previously firing the heat homogenizing plate 2 made a silicon carbide-based or aluminum nitride-based sintered body at about 1200° C. temperature.

EMBODIMENTS

Embodiment 1

A plurality of heat homogenizing plates 2 with a disk-like shape of 3 mm thickness and 340 mm outer diameter were produced by grinding and polishing a silicon carbide sintered-based body with a thermal conductivity of 100 W/m/K and in order to form an insulating layer 4 on one main face of each heat homogenizing plate 2, a glass paste produced by kneading a glass powder with ethyl cellulose as binder and terpineol as an organic solvent was applied by a screen printing method and heated to 150° C. for drying the organic solvent. After that, degreasing treatment was carried out at 550° C. for 30 minutes and further baking was carried out at a temperature from 700 to 900° C. to form the insulating layer 4 of glass with a thickness of 200 $\mu$m. Then, in order to form a heating element 5 on the insulating layer 4, a paste produced by mixing 20% by weight of a Au powder and 10% by weight of a Pt powder as conductive materials, 70% by weight of glass, and prescribed amounts of a binder and a solvent was printed in a prescribed pattern shape by a screen printing method and then heated to 150° C. for drying the organic solvent and further heated at 450° C. for 30 minutes for degreasing treatment and baked at a temperature of 500 to 700° C. to form the heating element 5 with a thickness of 50 $\mu$m.

The outer diameter of the heating element was set to be 320 mm (the diameter ratio 1.05) to 300 mm diameter of a wafer.

The width P, the gap G, and the surface area ratio S of strips of the heating element 5 were variously changed and test was carried out in the conditions shown in Table 1.

Recessed parts were formed at 7 points in the wafer mounting face of every heat homogenizing plate and wafer mounting pins made of a ceramic were buried therein so as to mount a wafer at a distance of 0.01 mm from the mounting face.

Each heat homogenizing plate produced in such a manner was subjected to evaluation of the printing property, the withstand voltage, the temperature dispersion of the wafer portion. Especially, for the temperature dispersion of the wafer portion, the evaluation was carried out while the wafer subjected to temperature measurement being rotated or shifted to different positions so as to detect the features of the heat generation patterns.

The evaluation standards were defined as follows: marking O in the case the temperature dispersion of the wafer portion at 150° C. was 0.5° C. or lower, and x in the case the temperature dispersion exceeds 0.5° C.

The evaluation results were shown in Table 6. Satisfactory heat generating pattern width P and gap G were shown as Pok and Gok, respectively, and unsatisfactory heat generating pattern width P and gap G were shown as Png and Gng, respectively.

According to these results, those simultaneously satisfying the following inequalities;

$0.15 \leq S \leq 0.85$, $0.3 \leq P \leq 6.71 \times S^2 + 1.52$, and $0.3 \leq G \leq 6.71 \times (1-S)^2 + 1.55$;

were found having 0.5° C. or lower temperature dispersion in the wafer subjected to temperature measurement and giving good results. However, in the case of S was 0.15 or smaller, the surface area of the heat generating portions was too small to sufficiently heat gaps where heating was not carried out, resulting in a wide temperature dispersion. On the contrary, in the case S exceeded 0.85, the portion where the resistor strips generate heat was too wide and accordingly the electric current was short-circuited in the folded back portions of the patterns and heat was locally generated to result in wide temperature dispersion. Similarly, even if S was in the range; $0.15 \leq S \leq 0.85$; in the case P exceeded the above-described inequality, the above-described state appeared in the folded back portions of the patterns to result in a wide temperature dispersion. If P was smaller than 0.3 mm, the thickness in micro-order could not be stabilized in the case patterns were formed by screen printing or the like to result in decrease of the reliability as the heating element and therefore, it was not preferable. Whereas, if G was less than 0.3 mm, in the case of carrying out control by a plurality of resistance circuits, the withstand voltage among the circuits sometimes did not satisfy 1.5 kV and therefore it was not preferable. On the contrary, if G exceeded the above-described inequality, the gap portions became so wide that some portions were not heated sufficiently to result in undesirable wide temperature dispersion.

Embodiment 2

A plurality of heat homogenizing plate s 2 with a disk-like shape of a thickness of 3 mm and an outer diameter of 300 mm, 315 mm, 340 mm, and 375 mm were produced by grinding and polishing a silicon carbide sintered-based body with a thermal conductivity of 100 W/m/K and in order to form an insulating layer 4 on one main face of each heat homogenizing plate 2, a glass paste produced by kneading a glass powder with ethyl cellulose as binder and terpineol as an organic solvent was applied by a screen printing method and heated to 150° C. for drying the organic solvent. After that, degreasing treatment was carried out at 550° C. for 30 minutes and further baking was carried out at a temperature from 700 to 900° C. to form the insulating layer 4 of glass with a thickness of 200 μm. Then, in order to form a heating element 5 on the insulating layer 4, a paste produced by mixing 20% by weight of a Au powder and 10% by weight of a Pt powder as conductive materials, 70% by weight of glass, and prescribed amounts of a binder and a solvent was printed in a prescribed pattern shape by a screen printing method and then heated to 150° C. for drying the organic solvent and further heated at 450° C. for 30 minutes for degreasing treatment and baked at a temperature of 500 to 700° C. to form the heating element 5 with a thickness of 50 μm.

In the following test, relatively to the wafer diameter 300 mm, the outer diameter of the respective heating element s was so set as to be 285 mm (0.95), 298 mm (0.98), 300 mm (1.00), 306 mm (1.02), 330 mm (1.10), and 360 mm (1.20) and ceramic disks with a diameter of 300 mm for the diameter ratio 0.95, 315 mm for 98% and 100% ratios, 340 mm for 1.02 and 1.10 ratios, and 375 mm for 1.20 ratio were employed.

The heat generating patterns were adjusted to be like a heat homogenizing plate according to the conditions shown in Table 1.

Recessed parts were formed at 7 points in the wafer mounting face of every heat homogenizing plate and supporting pins made of a ceramic for mounting a wafer were buried therein so as to mount the wafer at a distance of 0.01 mm from the mounting face.

Each heat homogenizing plate produced in such a manner was subjected to evaluation of the printing property, the withstand voltage, the temperature dispersion of the wafer portion. Especially, for the temperature dispersion of the wafer portion, the evaluation was carried out while the wafer subjected to temperature measurement being rotated or shifted to different positions so as to detect the features of the heat generation patterns. The respective evaluation results were as shown in Table 1.

TABLE 1

| No. | wafer/heat generation area [%] | temperature dispersion of wafer R [° C.] | time taken to be steady | temperature alteration time |
| --- | --- | --- | --- | --- |
| 1 | 95 | 1.32 | o | o |
| 2 | 98 | 0.96 | o | o |
| 3 | 100 | 0.65 | o | o |
| 4 | 102 | 0.36 | o | o |
| 5 | 110 | 0.25 | o | o |
| 6 | 120 | 0.25 | o | o | heat generation surface area ratio S 60%
line width P 2.50 [mm]
thickness of heat homogenizing plate t 3 mm
conductivity of heat homogenizing plate 100 [W/m/K]
Distance between wafer and mounting face d2 0.1 [mm]
gap G 2.00 [mm]

In the case the ratio of the outer diameter of each heating element to the wafer diameter was 1.02 or higher, a good result in the evenly heating property was obtained. However, in comparison of the cases of the diameter ratio of 1.10 and 1.20 to each other, not so significant improvement was observed. Taking the cost owing to enlargement of the diameter and the increase of the power consumption, the diameter ratio was not preferable to exceeds 1.20. On the other hand, if the diameter ratio was 1.00 or lower, heat release in the outer circumferential part could not be compensated to cause significant temperature decrease in the outer circumferential part of the wafer and it was therefore unsuitable.

Embodiment 3

An alumina sintered body of a thermal conductivity of 30 W/m/K, an aluminum nitride sintered body of a thermal conductivity of 50 W/m/K, and silicon carbide-based sintered bodies of a thermal conductivity of 80 W/m/K and 150 W/m/K, respectively, were employed. These sintered bodies were ground and polished to produce a large number of heat homogenizing plate s 2 with a disk-like shape of 1 mm thickness and 340 mm outer diameter.

In order to form an insulating layer 4 on one main face of each heat homogenizing plate 2, a glass paste produced by kneading a glass powder with ethyl cellulose as binder and terpineol as an organic solvent was applied by a screen printing method and heated to 150° C. for drying the organic solvent. After that, degreasing treatment was carried out at 550° C. for 30 minutes and further baking was carried out at a temperature from 700 to 900° C. to form the insulating layer 4 of glass with a thickness of 200 μm. Then, in order to form a heating element 5 on the insulating layer 4, a paste produced by mixing 20% by weight of a Au powder and 10% by weight of a PL powder as conductive materials, 70% by weight of glass, and prescribed amounts of a binder and a solvent was printed in a prescribed pattern shape by a screen printing method and then heated to 150° C. for drying the organic solvent and further heated at 450° C. for 30 minutes for degreasing treatment and baked at a temperature of 500 to 700° C. to form the heating element 5 with a thickness of 50 μm.

The patterns were designed as shown in Table 2. Recessed parts were formed at 7 points in the wafer mounting face of every heat homogenizing plate and wafer mounting pins made of a ceramic were buried therein so as to mount a wafer at a distance of 0.01 mm from the mounting face.

Each heat homogenizing plate produced in such a manner was subjected to evaluation of the printing property, the withstand voltage, the temperature dispersion of the wafer portion. Especially, for the temperature dispersion of the wafer portion, the evaluation was carried out while the wafer subjected to temperature measurement being rotated or shifted to different positions so as to detect the features of the heat generation patterns. The evaluation results were shown in Table 2.

TABLE 2

| No. | thermal conductivity of heat homogenizing plate [W/m/K] | temperature dispersion of wafer R [° C.] | time taken to be steady | temperature alteration time |
| --- | --- | --- | --- | --- |
| 7 | 30 | 1.02 | ○ | ○ |
| 8 | 50 | 0.63 | ○ | ○ |
| 9 | 80 | 0.35 | ○ | ○ |
| 10 | 150 | 0.24 | ○ | ○ | t 3 [mm], d2 0.1 [mm], S 60 [%], P 2.50 [mm], G 2.00 [mm], wafer/heat generation area 105 [%]

As being understood from Table 2, good results were obtained in the case the thermal conductivity was 80 W/m/K. However, those with 50 W/m/K or lower thermal conductivity were found having wide wafer temperature dispersion and therefore determined to be unsuitable. That was supposedly attributed to that their thickness was thin and in addition to that the thermal conductivity was low and therefore heat diffusion was not carried out sufficiently.

Embodiment 4

A plurality of heat homogenizing plate s 2 with a disk-like shape of an outer diameter of 340 mm and a thickness of 0.5 mm, 1 mm, 8 mm, and 10 mm were produced by grinding and polishing a silicon carbide sintered-based body with a thermal conductivity of 100 W/m/K and in order to form an insulating layer 4 on one main face of each heat homogenizing plate 2, a glass paste produced by kneading a glass powder with ethyl cellulose as binder and terpineol as an organic solvent was applied by a screen printing method and heated to 150° C. for drying the organic solvent. After that, degreasing treatment was carried out at 550° C. for 30 minutes and further baking was carried out at a temperature from 700 to 900° C. to form the insulating layer 4 of glass with a thickness of 200 μm. Then, in order to form a heating element 5 on the insulating layer 4, a paste produced by mixing 20% by weight of a Au powder and 10% by weight of a Pt powder as conductive materials, 70% by weight of glass, and prescribed amounts of a binder and a solvent was printed in a prescribed pattern shape by a screen printing method and then heated to 150° C. for drying the organic solvent and further heated at 450° C. for 30 minutes for degreasing treatment and baked at a temperature of 500 to 700° C. to form the heating element 5 with a thickness of 50 μm.

Recessed parts were formed at 7 points in the wafer mounting face of every heat homogenizing plate 2 and wafer supporting pins made of a ceramic were buried therein so as to mount the wafer at a distance of 0.01 mm from the mounting face.

Each heat homogenizing plate produced in such a manner was subjected to evaluation of the printing property, the withstand voltage, the temperature dispersion of the wafer portion. Especially, for the temperature dispersion of the wafer portion, the evaluation was carried out while the wafer subjected to temperature measurement being rotated or shifted to different positions so as to detect the features of the heat generation patterns.

The respective evaluation results were as shown in Table 3.

TABLE 3

| No. | thickness of heat homogenizing plate t [mm] | wafer/heat generation area [%] | temperature dispersion of wafer R [° C.] | time taken to be steady | temperature alteration time |
|---|---|---|---|---|---|
| 11 | 0.5 | 105 | 0.73 | ○ | ○ |
| 12 | 1.0 | ↑ | 0.41 | ○ | ○ |
| 13 | 5 | ↑ | 0.26 | ○ | ○ |
| 14 | 6 | ↑ | 0.25 | Δ | x | thermal conductivity of heat homogenizing plate 100 [W/m/K] d2 0.1 [mm], S 60 [%] P 2.50 [mm], G 2.00 [mm] wafer/heat generation area 105 [%]

From Table 3, it was found that, if the thickness t of the heat homogenizing plate 2 was in a range; 1 mm≦t≦8 mm; it took only 4 minutes or less to narrow the wafer temperature dispersion, to respond to the temperature alteration, and especially complete cooling. However, in the case the thickness was 0.5 mm or less, the wafer temperature dispersion was wide and therefore it was not suitable. It was supposedly attributed to that the thickness was too thin to sufficiently carry out heat diffusion. On the other hand, in the case of 10 mm or more, although the wafer temperature dispersion was found well, it took more than 4 minutes to change the temperature and therefore it was determined to be unsuitable. It was attributed to that the heat capacity was too high owing to the excess thickness.

Example 5

A plurality of heat homogenizing plate s 2 with a disk-like shape of a thickness of 3 mm and an outer diameter of 340 mm were produced by grinding and polishing a silicon carbide sintered-based body with a thermal conductivity of 100 W/m/K and in order to form an insulating layer 4 on one main face of each heat homogenizing plate 2, a glass paste produced by kneading a glass powder with ethyl cellulose as binder and terpineol as an organic solvent was applied by a screen printing method and heated to 150° C. for drying the organic solvent. After that, degreasing treatment was carried out at 550° C. for 30 minutes and further baking was carried out at a temperature from 700 to 900° C. to form the insulating layer 4 of glass with a thickness of 200 μm. Then, in order to form a heating element 5 on the insulating layer 4, a paste produced by mixing 20% by weight of a Au powder and 10% by weight of a Pt powder as conductive materials, 70% by weight of glass, and prescribed amounts of a binder and a solvent was printed in a prescribed pattern shape by a screen printing method and then heated to 150° C. for drying the organic solvent and further heated at 450° C. for 30 minutes for degreasing treatment and baked at a temperature of 500 to 700° C. to form the heating element 5 with a thickness of 50 μm.

Recessed parts were formed at 7 points in the wafer mounting face of every heat homogenizing plate 2 and wafer supporting pins made of a ceramic were buried therein and the distance (d2) between a wafer and the heat homogenizing plate was adjusted to be 0.002 mm, 0.005 mm, 0.030 mm, 0.050 mm, and 0.070 mm by adjusting the height of the mounting pins.

Each heat homogenizing plate produced in such a manner was subjected to evaluation of the printing property, the withstand voltage, the temperature dispersion of the wafer portion. Especially, for the temperature dispersion of the wafer portion, the evaluation was carried out while the wafer subjected to temperature measurement being rotated or shifted to different positions so as to detect the features of the heat generation patterns.

The respective evaluation results were as shown in Table 4.

TABLE 4

| No. | distance between wafer and mounting face d2 [mm] | temperature dispersion of wafer R [° C.] | time taken to be steady | temperature alteration time |
|---|---|---|---|---|
| 15 | 0.02 | 0.57 | ○ | ○ |
| 16 | 0.05 | 0.38 | ○ | ○ |
| 17 | 0.30 | 0.31 | ○ | ○ |
| 18 | 0.50 | 0.27 | ○ | ○ |
| 19 | 0.70 | 0.24 | x | ○ | t; 3 [mm], thermal conductivity of heat homogenizing plate; 100 [W/m/K], S; 60 [%], P; 2.50 [mm], G; 2.00 [mm], and wafer/heat generation area; 105 [%]

From Table 4, it was found that, in the case the distance d2 between the wafer and the heat homogenizing plate was in a range; 0.05 mm≦d≦0.5 mm; good results in both the wafer temperature dispersion and the time taken to steady state were obtained. However, in the case d2 was 0.02 mm, the temperature dispersion was wide and it was supposedly attributed to that the wafer itself was partially brought into contact with the heat homogenizing plate owing to its warping. On the other hand, in the case d2 was 0.7 mm or higher, although the wafer temperature dispersion was found well, it took more than 1 minute to reach the steady state at the aimed temperature from the time of mounting the water of an ordinary temperature and therefore it was determined to be unsuitable. It was attributed to an undesirable cycle that if d2 was too wide, heat transmission to the wafer took a long time, heat release was therefore retarded in the heat homogenizing plate side to slow down the temperature decrease, increase of output took a long time, and the temperature increase was delayed.

Embodiment 6

A disk-like silicon carbide sintered-based body with a thermal conductivity of 80 W/m/K or higher and an outer diameter of 300 mm was obtained by mixing 3% by weight of $B_4C$, 2% by weight of carbon, and proper amounts of a binder and a solvent with a silicon carbide raw material, granulating the mixture, and then molding the granulated mixture at 100 MPa molding pressure, and firing the molded product at 1,900 to 2,100° C.

Nine types of heat homogenizing plate s 2 with a disk-like shape of a thickness in a range from 1 to 9 mm changed 1 by 1 mm and an outer diameter of 250 mm were produced by grinding and polishing both main faces and the outer circumferential parts of silicon carbide sintered-based bodies produced in such a manner described above and further heated at 1,200° C. for 1 hour in atmospheric air to form an oxide film 24 on the surface of each of the above-described sintered bodies. After that, a glass paste produced by kneading a glass powder with ethyl cellulose as binder and terpineol as an organic solvent was applied by a screen printing method and heated to 80° C. for drying the organic solvent and after that, degreasing treatment was carried out at 450° C. for 30 minutes and further baking was carried out at a temperature from 700 to 900° C. to form an insulating layer 4 of glass with a thickness of 400 μm. Then, in order to form a heating element 5 on the insulating layer 4, a glass paste mixed with a Au powder and a Pt powder as conductive materials was printed in a prescribed pattern shape by a screen printing method and then heated to 80° C. for drying an organic solvent and further heated at 450° C. for 30 minutes for degreasing treatment and baked at a temperature of 700 to 900° C. to form the heating element 5 with a thickness of 30 μm. The pattern outer diameter Φ was changed from 190 to 250 mm 10 by 10 mm to be seven types.

Further, as a support 11, two sheet-like structure bodies 13 made of a 2.5 mm thick SUS 304 and each having an opening in 40% surface area of one main face were prepared and in one between them, a thermocouple 10 was formed, an electric communication terminal 7 was formed at a prescribed position, and both structure bodies were fixed on a side wall portion similarly made of SUS 304 by screwing to obtain a support 11.

Further, an electric supply portion 6 was formed using a gold paste by a transfer method and subjected to baking treatment at 900° C. After that, a water heating apparatus 1 of the invention shown in FIG. 1 was produced by fixing the electric supply portion 6 by screwing in the support 11 having the electric communication terminal 7 equipped with a spring while an elastic body 8 being set in the outer circumferential part. The width of the heat homogenizing plate 2 support portion in the support 11 was adjusted to be 3 mm.

The flatness of the mounting face 3 of each heat homogenizing plate 2 was adjusted to be 40 μm.

The projection height of supporting pins 20 from the mounting face 3 was adjusted to be 100 μm and the number of the supporting pins 20 was three in the outer circumferential part and one in the center part.

Electricity was applied to the electric communication terminal 7 of each wafer heating apparatus 1 obtained in such a manner to keep the wafer heating apparatus 1 at 200° C. and the temperature distribution in the surface of a wafer mounted on the mounting face 3 was evaluated by measuring the temperature dispersion in steady state at nine points; each three points at equal intervals in the circumference of three concentric circles of a radius of 40 mm, 60 mm, and 90 mm from the center of each heat homogenizing plate 2, keeping at 150° C. for 30 minutes, and after that evaluating the transition property of the temperature dispersion in the plane of the wafer during period from the time the wafer W was set to the time wafer W was held at 150° C. The judgment basis for the evaluation was determined as it was good if the dispersion of the temperature in the steady state at 200° C. was within 1° C. and the dispersion of the temperature in the transition state of the wafer W was within 10° C. and NG if the dispersion was over these ranges. After that, a heating and cooling cycle test involving heating and cooling between 40° C. and 200° C. at temperature increasing rate of 200° C./min and temperature decreasing rate of 50° C./min and at every 1 kilo cycles, similar temperature distribution evaluation was carried out until the evaluation NG was detected. For those found good at 30 kilo cycles, the evaluation was finished judging good at 30 kilo cycles. The judgment standard was determined as those that were found NG after 10,000 cycles or more were good.

Figure 10:
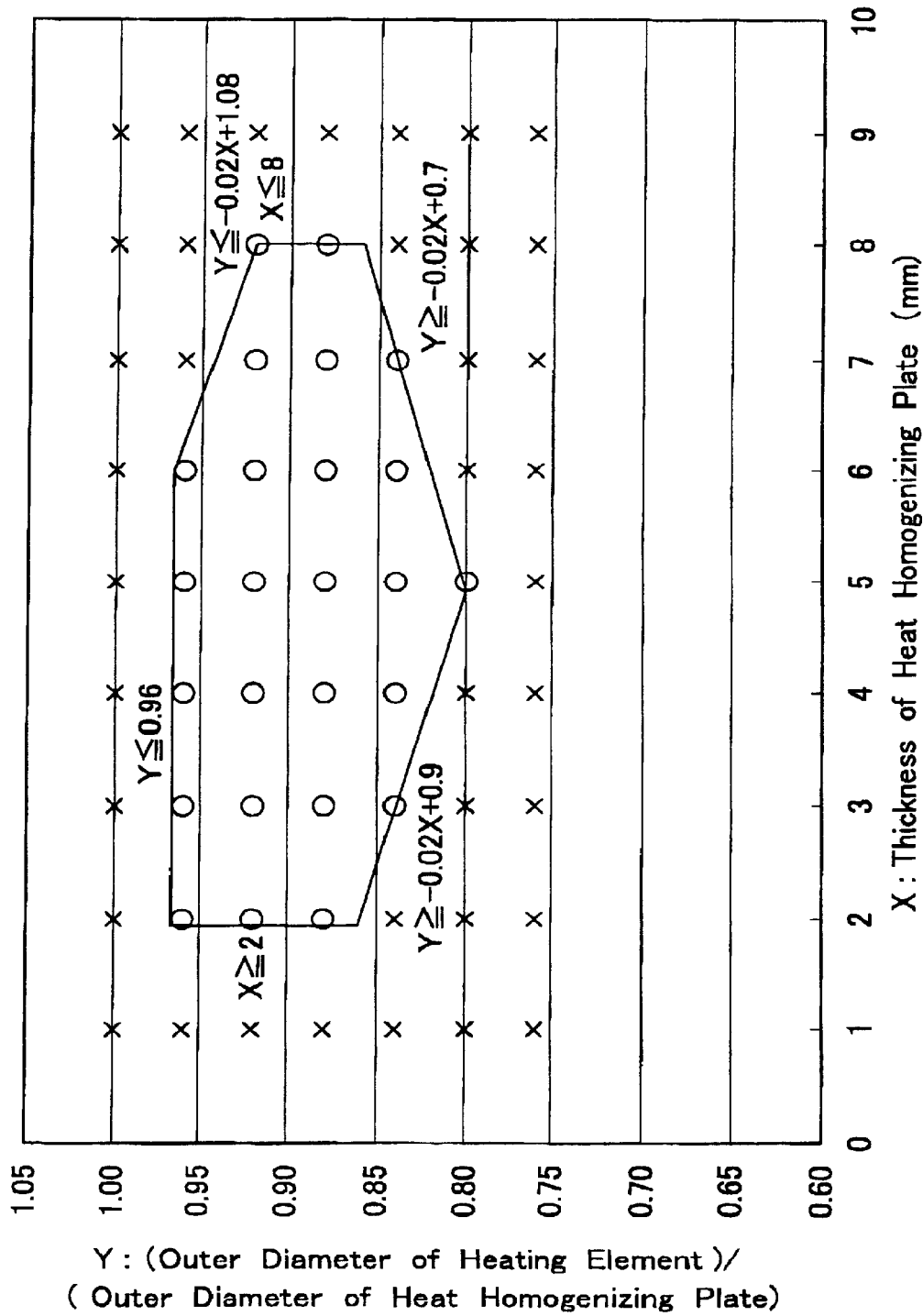
FIG. 10 shows a graph of experiment data showing the relation between the outer diameter ratio of heating element—a heat homogenizing plate and heating element.
Figure 11:
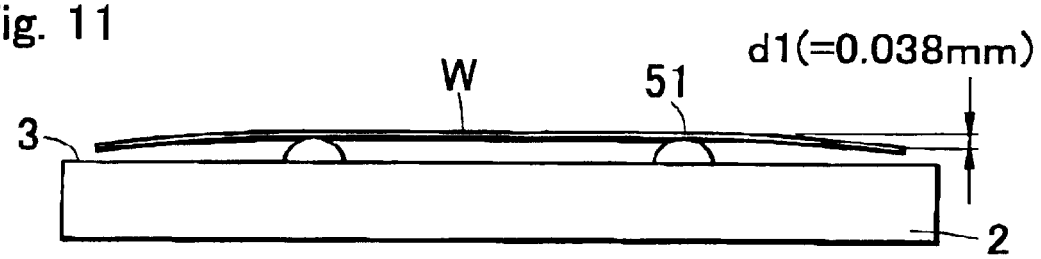
FIG. 11 shows a side view of a heat homogenizing plate used for a conventional wafer heating apparatus.
Figure 12:
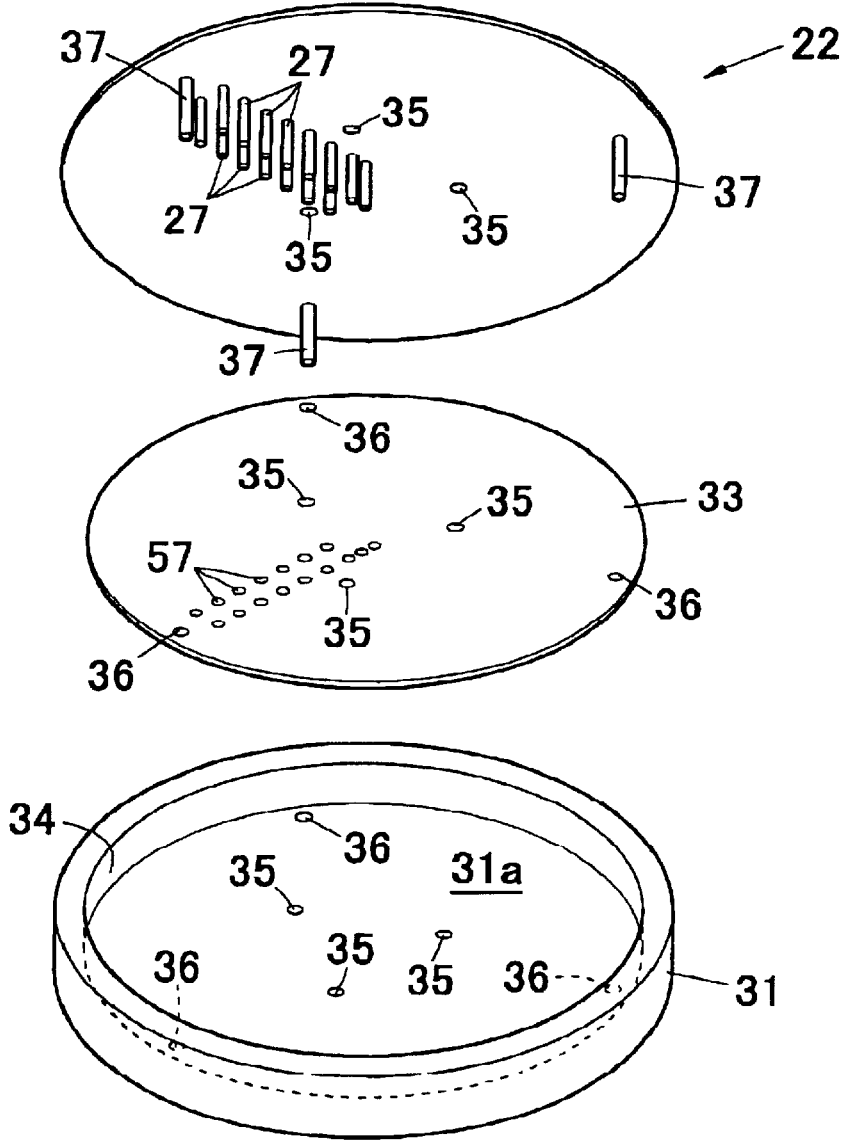
FIG. 12 shows an explosion of a heat homogenizing plate used for a conventional wafer heating apparatus.
Figure 13:
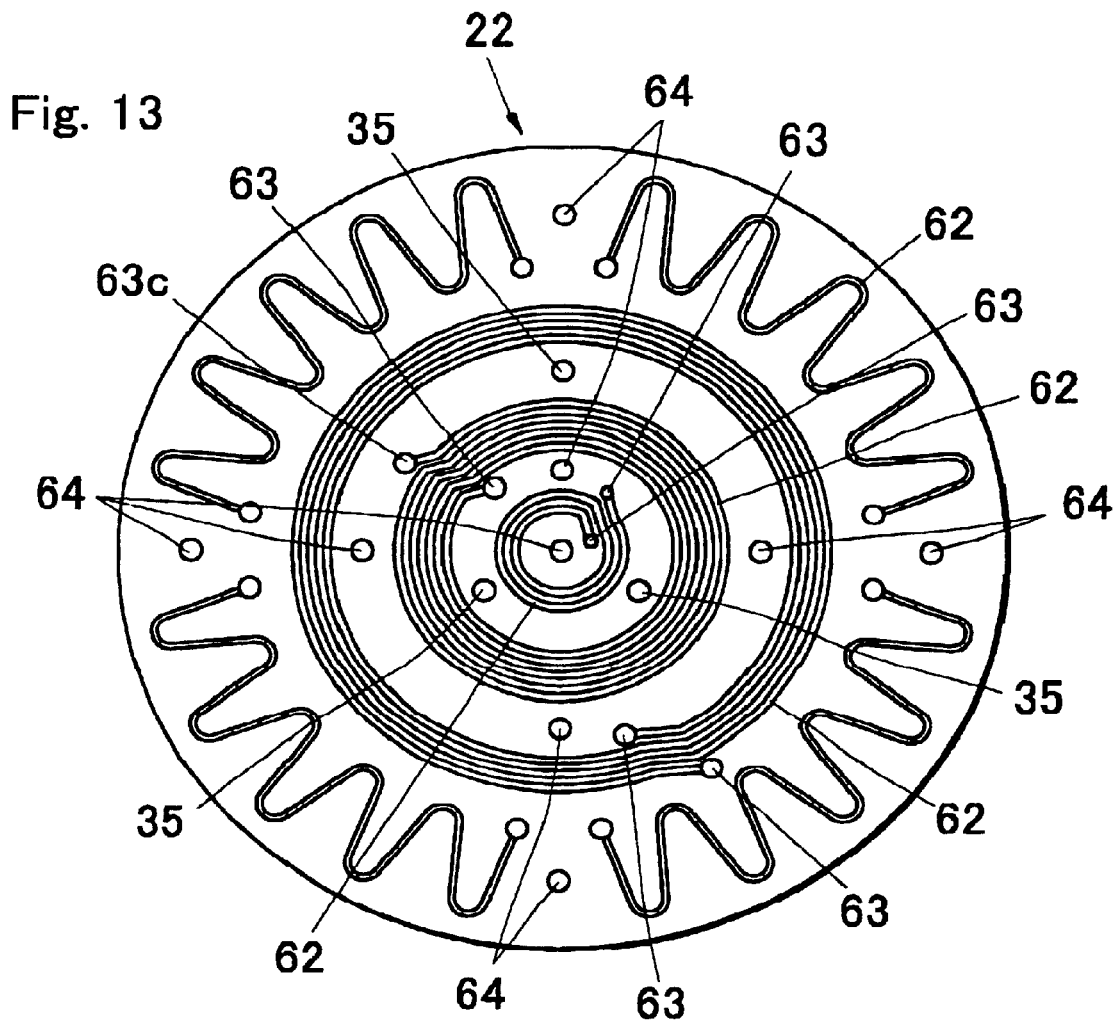
FIG. 13 shows a lower face view of a heat homogenizing plate showing an embodiment of patterns of a heating element used for a conventional wafer heating apparatus.
Figure 14:
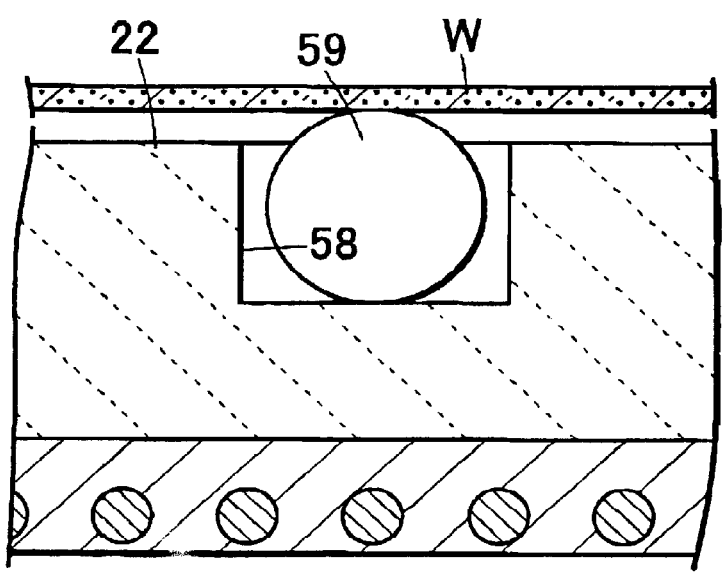
FIG. 14 shows a partial cross-sectional view of a heat homogenizing plate used for a conventional wafer heating apparatus.

The results were shown in FIG. 10 and Table 5 where ΔT1 shows temperature dispersion on the wafer in steady state and ΔT2 shows temperature dispersion on the wafer in a transition state during increasing its temperature.

TABLE 5

| No. | t mm | diameter ratio B/C | ΔT1 (° C.) | ΔT2 (° C.) | cycle test | judgment |
|---|---|---|---|---|---|---|
| 1 | 1 | 0.76 | 3.7 | 30 | good for 30 kc | x |
| 2 | | 0.80 | 2.7 | 27 | good for 30 kc | x |
| 3 | | 0.84 | 2.3 | 25 | good for 30 kc | x |
| 4 | | 0.88 | 1.8 | 20 | good for 30 kc | x |
| 5 | | 0.92 | 1.3 | 18 | good for 30 kc | x |
| 6 | | 0.96 | 1.3 | 16 | good for 30 kc | x |
| 7 | | 1.00 | 1.2 | 15 | NG for 8 kc | x |
| 8 | 2 | 0.76 | 3.2 | 27 | good for 30 kc | x |
| 9 | | 0.80 | 1.8 | 15 | good for 30 kc | x |
| 10 | | 0.84 | 1.5 | 13 | good for 30 kc | x |
| 11 | | 0.88 | 0.9 | 10 | good for 30 kc | o |
| 12 | | 0.92 | 0.8 | 9 | good for 30 kc | o |
| 13 | | 0.96 | 0.7 | 8 | good for 30 kc | o |
| 14 | | 1.00 | 0.7 | 8 | NG for 5 kc | x |
| 15 | 3 | 0.76 | 2.5 | 20 | good for 30 kc | x |
| 16 | | 0.80 | 1.4 | 13 | good for 30 kc | x |
| 17 | | 0.84 | 1.0 | 9 | good for 30 kc | o |
| 18 | | 0.88 | 0.7 | 7 | good for 30 kc | o |
| 19 | | 0.92 | 0.6 | 6 | good for 30 kc | o |
| 20 | | 0.96 | 0.4 | 5 | good for 30 kc | o |
| 21 | | 1.00 | 0.4 | 5 | NG for 6 kc | x |
| 22 | 4 | 0.76 | 2.3 | 23 | good for 30 kc | x |
| 23 | | 0.80 | 1.5 | 12 | good for 30 kc | x |
| 24 | | 0.84 | 0.9 | 8 | good for 30 kc | o |
| 25 | | 0.88 | 0.7 | 7 | good for 30 kc | o |
| 26 | | 0.92 | 0.5 | 6 | good for 30 kc | o |
| 27 | | 0.96 | 0.4 | 5 | NG for 20 kc | o |
| 28 | | 1.00 | 0.4 | 5 | NG for 4 kc | x |
| 29 | 5 | 0.76 | 1.7 | 17 | good for 30 kc | x |
| 30 | | 0.80 | 0.9 | 10 | good for 30 kc | o |
| 31 | | 0.84 | 0.7 | 8 | good for 30 kc | o |
| 32 | | 0.88 | 0.6 | 8 | good for 30 kc | o |
| 33 | | 0.92 | 0.4 | 7 | good for 30 kc | o |
| 34 | | 0.96 | 0.4 | 7 | NG for 20 kc | o |
| 35 | | 1.00 | 0.4 | 7 | NG for 3 kc | x |
| 36 | 6 | 0.76 | 1.5 | 17 | good for 30 kc | x |
| 37 | | 0.80 | 0.8 | 12 | good for 30 kc | x |
| 38 | | 0.84 | 0.7 | 9 | good for 30 kc | o |
| 39 | | 0.88 | 0.5 | 8 | good for 30 kc | o |
| 40 | | 0.92 | 0.4 | 8 | good for 30 kc | o |
| 41 | | 0.96 | 0.4 | 7 | NG for 20 kc | o |
| 42 | | 1.00 | 0.3 | 7 | NG for 3 kc | x |
| 43 | 7 | 0.76 | 1.3 | 15 | good for 30 kc | x |
| 44 | | 0.80 | 0.7 | 12 | good for 30 kc | x |
| 45 | | 0.84 | 0.6 | 10 | good for 30 kc | o |
| 46 | | 0.88 | 0.5 | 9 | good for 30 kc | o |
| 47 | | 0.92 | 0.4 | 10 | good for 30 kc | o |
| 48 | | 0.96 | 0.4 | 11 | NG for 20 k | x |
| 49 | | 1.00 | 0.3 | 12 | NG for 4 kc | x |
| 50 | 8 | 0.76 | 1.0 | 15 | good for 30 kc | x |
| 51 | | 0.80 | 0.7 | 13 | good for 30 kc | x |
| 52 | | 0.84 | 0.5 | 11 | good for 30 kc | x |
| 53 | | 0.88 | 0.5 | 9 | good for 30 kc | o |
| 54 | | 0.92 | 0.4 | 10 | good for 30 kc | o |
| 55 | | 0.96 | 0.3 | 11 | NG for 20 kc | x |
| 56 | | 1.00 | 0.3 | 11 | NG for 2 kc | x |
| 57 | 9 | 0.76 | 0.9 | 13 | good for 30 kc | x |
| 58 | | 0.80 | 0.7 | 12 | good for 30 kc | x |
| 59 | | 0.84 | 0.5 | 11 | good for 30 kc | x |
| 60 | | 0.88 | 0.5 | 11 | good for 30 kc | x |
| 61 | | 0.92 | 0.4 | 11 | good for 30 kc | x |
| 62 | | 0.96 | 0.3 | 11 | NG for 20 kc | x |
| 63 | | 1.00 | 0.3 | 11 | NG for 2 kc | x |

As being understood from Table 5 and FIG. 10, where X is defined as thickness of the heat homogenizing plate 2 and Y is as ratio of outer diameter B of the heating element 5 divided by the outer diameter C of the heat homogenizing plate, it is found that if X is lower than 2 mm or more than 8 mm, the transition temperature dispersion exceeds 10° C.

Further, if Y exceeds 0.96, the result of the heating and cooling cycle test was NG at less than 3,000 cycles. Also, in the case Y<−0.02X+0.9, Y<0.02X+0.7, and Y>−0.02X+1.08, the transition temperature dispersion exceeds 10° C. On the other hand, in the case X and Y are adjusted as to satisfy the conditions of $2 \leq X \leq 8$ and $Y \leq 0.96$ and $Y \geq -0.02X+0.9$ and $Y \geq 0.02X+0.7$, and $Y \leq -0.02X+1.08$, the lifetime in the heating and cooling cycle test is 10 kilocycles or more, the steady state temperature dispersion was 1° C. or lower, and the transition state temperature dispersion is 10° C. or lower.

Embodiment 7

In this example, 17 kinds of samples of heat homogenizing plate s 2 with an outer diameter changed from 210 to 270 mm by 10 by 10 mm, a thickness of 4 mm, and a size Φ of the heat generating patterns changed from 190 to 270 mm by 5 mm were produced in the same manner as Example 6. After that, similarly to Example 6, evaluation of the temperature distribution and the transition property was carried out. The judgment standard was also made same as that of Example 6. The results were shown in Table 6.

TABLE 6

| No. | G mm | distance bet. holding portion and A (mm) | differ. of B from diam. of wafer (mm) | Y: | Δ T1 (° C.) | Δ T2 (° C.) | cycle test | |
|---|---|---|---|---|---|---|---|---|
| 1 | 210 | 7 | −10 | 0.90 | 2.0 | 20 | good/30 kc | x |
| 2 | | 4.5 | −5 | 0.93 | 1.5 | 15 | NG/25 kc | x |
| 3 | | 2 | 0 | 0.95 | 1.1 | 10 | NG/15 kc | x |
| 4 | | 0 | 5 | 0.98 | 0.9 | 8 | NG/5 kc | x |
| 5 | | 0 | 10 | 1.00 | 0.8 | 7 | NG/3 kc | x |
| 6 | 220 | 12 | −10 | 0.88 | 1.9 | 21 | good/30 kc | x |
| 7 | | 9.5 | −5 | 0.89 | 1.8 | 14 | good/30 kc | x |
| 8 | | 7 | 0 | 0.91 | 1.1 | 12 | good/30 kc | x |
| 9 | | 4.5 | 5 | 0.93 | 0.9 | 9 | NG/23 kc | ○ |
| 10 | | 2 | 10 | 0.95 | 0.8 | 8 | NG/15 kc | ○ |
| 11 | | 0 | 15 | 0.99 | 0.6 | 7 | NG/5 kc | x |
| 12 | | 0 | 20 | 1.00 | 0.6 | 7 | NG/4 kc | x |
| 13 | 230 | 17 | −10 | 0.83 | 2.0 | 19 | good/30 kc | x |
| 14 | | 14.5 | −5 | 0.85 | 1.7 | 15 | good/30 kc | x |
| 15 | | 12 | 0 | 0.07 | 1.3 | 11 | good/30 kc | x |
| 16 | | 9.5 | 5 | 0.89 | 1.0 | 9 | good/30 kc | Δ |
| 17 | | 7 | 10 | 0.91 | 0.9 | 8 | good/30 kc | ○ |
| 18 | | 4.5 | 15 | 0.93 | 0.8 | 8 | NG/25 kc | ○ |
| 19 | | 2 | 20 | 0.98 | 0.6 | 7 | NG/12 kc | Δ |
| 20 | | 0 | 25 | 0.98 | 0.8 | 6 | NG/6 kc | x |
| 21 | | 0 | 30 | 1.00 | 0.5 | 6 | NG/4 kc | x |
| 22 | 240 | 22 | −10 | 0.79 | 1.7 | 23 | good/30 kc | x |
| 23 | | 19.5 | −5 | 0.81 | 1.5 | 18 | good/30 kc | x |
| 24 | | 17 | 0 | 0.83 | 1.3 | 12 | good/30 kc | x |
| 25 | | 14.5 | 5 | 0.85 | 1.0 | 10 | good/30 kc | Δ |
| 26 | | 12 | 10 | 0.88 | 0.9 | 8 | good/30 kc | ○ |
| 27 | | 9.5 | 15 | 0.90 | 0.8 | 8 | good/30 kc | ○ |
| 28 | | 7 | 20 | 0.92 | 0.7 | 7 | good/30 kc | ○ |
| 29 | | 4.5 | 25 | 0.94 | 0.6 | 7 | good/30 kc | ○ |
| 30 | | 2 | 30 | 0.96 | 0.8 | 8 | NG/18 kc | ○ |
| 31 | | 0 | 35 | 0.98 | 0.5 | 5 | NG/6 kc | x |
| 32 | | 0 | 40 | 1.00 | 0.4 | 5 | NG/4 kc | x |
| 33 | 250 | 27 | −10 | 0.76 | 2.3 | 23 | good/30 kc | x |
| 34 | | 24.5 | −5 | 0.78 | 1.8 | 18 | good/30 kc | x |
| 35 | | 22 | 0 | 0.80 | 1.5 | 12 | good/30 kc | x |
| 36 | | 19.5 | 5 | 0.82 | 1.0 | 9 | good/30 kc | ○ |
| 37 | | 17 | 10 | 0.84 | 0.8 | 8 | good/30 kc | ○ |
| 38 | | 14.5 | 15 | 0.80 | 0.8 | 8 | good/30 kc | ○ |
| 39 | | 12 | 20 | 0.86 | 0.7 | 7 | good/30 kc | ○ |
| 40 | | 9.5 | 25 | 0.90 | 0.6 | 7 | good/30 kc | ○ |
| 41 | | 7 | 30 | 0.92 | 0.5 | 6 | good/30 kc | ○ |
| 42 | | 4.5 | 35 | 0.94 | 0.5 | 5 | NG/27 kc | ○ |
| 43 | | 2 | 40 | 0.96 | 0.4 | 5 | NG/20 kc | ○ |
| 44 | | 0 | 45 | 0.98 | 0.4 | 6 | NG/7 kc | x |
| 45 | | 0 | 50 | 1.00 | 0.4 | 5 | NG/4 kc | x |
| 46 | 260 | 32 | 10 | 0.73 | 2.2 | 19 | good/30 kc | x |
| 47 | | 29.5 | −5 | 0.75 | 1.9 | 18 | good/30 kc | x |
| 48 | | 27 | 0 | 0.77 | 1.5 | 13 | good/30 kc | x |
| 49 | | 24.5 | 5 | 0.79 | 1.2 | 11 | good/30 kc | x |
| 50 | | 22 | 10 | 0.81 | 1.0 | 10 | good/30 kc | Δ |
| 51 | | 19.5 | 10 | 0.83 | 0.9 | 8 | good/30 kc | ○ |
| 52 | | 17 | 20 | 0.85 | 0.8 | 8 | good/30 kc | ○ |
| 53 | | 14.5 | 25 | 0.87 | 0.8 | 7 | good/30 kc | ○ |
| 54 | | 12 | 30 | 0.88 | 0.7 | 7 | good/30 kc | ○ |
| 55 | | 9.5 | 35 | 0.90 | 0.8 | 6 | good/30 kc | ○ |
| 56 | | 7 | 40 | 0.92 | 0.5 | 5 | good/30 kc | ○ |
| 57 | | 4.5 | 45 | 0.94 | 0.5 | 5 | NG/29 kc | ○ |
| 58 | | 2 | 50 | 0.96 | 0.4 | 6 | NG/18 kc | ○ |
| 59 | | 0 | 55 | 0.98 | 0.4 | 5 | NG/6 kc | x |

TABLE 6-continued

| No. | G mm | distance bet. holding portion and A (mm) | differ. of B from diam. of wafer (mm) | Y: | Δ T1 (° C.) | Δ T2 (° C.) | cycle test | |
|---|---|---|---|---|---|---|---|---|
| 60 | | 0 | 60 | 1.00 | 0.4 | 6 | NG/3 kc | x |
| 61 | 270 | 37 | −10 | 0.70 | 2.3 | 21 | good/30 kc | x |
| 62 | | 34.5 | −5 | 0.72 | 2.0 | 17 | good/30 kc | x |
| 63 | | 32 | 0 | 0.74 | 1.7 | 15 | good/30 kc | x |
| 64 | | 29.5 | 5 | 0.76 | 1.5 | 12 | good/30 kc | x |
| 65 | | 27 | 10 | 0.78 | 1.2 | 10 | good/30 kc | x |
| 66 | | 24.5 | 15 | 0.80 | 1.0 | 9 | good/30 kc | o |
| 67 | | 22 | 20 | 0.81 | 0.9 | 8 | good/30 kc | o |
| 68 | | 19.5 | 25 | 0.83 | 0.8 | 8 | good/30 kc | o |
| 69 | | 17 | 30 | 0.85 | 0.8 | 7 | good/30 kc | o |
| 70 | | 14.5 | 35 | 0.87 | 0.7 | 7 | good/30 kc | o |
| 71 | | 12 | 40 | 0.89 | 0.6 | 6 | good/30 kc | o |
| 72 | | 9.5 | 45 | 0.91 | 0.5 | 5 | good/30 kc | o |
| 73 | | 7 | 50 | 0.93 | 0.5 | 5 | good/30 kc | o |
| 74 | | 4.5 | 55 | 0.94 | 0.4 | 6 | good/30 kc | o |
| 75 | | 2 | 60 | 0.96 | 0.4 | 5 | NG/22 kc | o |
| 76 | | 0 | 65 | 0.95 | 0.4 | 6 | NG/8 kc | x |
| 77 | | 0 | 70 | 1.00 | 0.4 | 5 | NG/5 kc | x |

As being understood from Table 6, if the distance between the heat homogenizing plate holding part and the heating element was narrower than 2 mm, the life in the heating and cooling cycle test was 10,000 cycles or shorter. Also, if (the heating element diameter)—(the wafer diameter) was less than 5 mm or the size of the heating element relative to the mounting face was less than 80%, the steady time temperature dispersion exceeded 1° C. and the transition time temperature dispersion exceeded 10° C. On the other hand, in the case the distance between the heat homogenizing plate holding part and the heating element was adjusted to be 2 mm wider, and also, (the heating element diameter)—(the wafer diameter) was adjusted to be 5 mm or higher, the size of the heating element relative to the mounting face was adjusted to be 80 to 96%, the life in the heating and cooling cycle test could be prolonged to 10,000 cycles or longer, the steady time temperature dispersion could be suppressed to 1° C. and the transition time temperature dispersion to 10° C. That tendency was found not depending on the outer diameter of the mounting face, that is, the size of the apparatus.

Embodiment 8

In this example, samples of heat homogenizing plate s 2 were produced in the same manner as Example 6 except that an outer diameter was changed from 210 to 270 mm by 5 mm, a thickness was set to be 4 mm, and a size of the heat generating patterns was fixed to be 0.95 times as large as the size of the heat homogenizing plate 2. After that, similarly to Example 6, evaluation of the temperature distribution and the transition property was carried out. Further, after that, heating to 200° C. was carried out again and the power consumption quantity was measured after 30 minuets.

A judgment was made the same as those of Example 1 for the temperature distribution and the transition property and for the power consumption quantity, those having the power consumption of 300 W or lower so as to make simultaneous use of 10 heating apparatuses possible under electric application conditions of 200 V and 15A were determined to be good.

The results were shown in Table 7.

TABLE 7

| No. | (outer diameter of heat homogenizing plate C)/ diameter of wafer (%) | temperature dispersion in steady state (° C.) | temperature dispersion in transition state (° C.) | power consumption (W) | judgment |
|---|---|---|---|---|---|
| 1 | 105.0 | 1.1 | 10 | 196 | x |
| 2 | 107.5 | 0.9 | 9 | 205 | o |
| 3 | 110.0 | 0.8 | 8 | 215 | o |
| 4 | 112.5 | 0.7 | 8 | 225 | o |
| 5 | 115.0 | 0.6 | 7 | 235 | o |
| 6 | 117.5 | 0.6 | 7 | 245 | o |
| 7 | 120.0 | 0.6 | 7 | 256 | o |
| 8 | 122.5 | 0.6 | 6 | 266 | o |
| 9 | 125.0 | 0.5 | 5 | 277 | o |
| 10 | 127.5 | 0.5 | 5 | 289 | o |
| 11 | 130.0 | 0.5 | 5 | 300 | Δ |
| 12 | 132.5 | 0.5 | 5 | 312 | x |
| 13 | 135.0 | 0.4 | 6 | 324 | x |

As being understood from Table 7, if the size of the wafer mounting face to the diameter of the wafer to be treated was 1.05 times or smaller, the steady time temperature dispersion exceeded 1° C. and the transition time temperature dispersion exceeded 10° C. On the other hand, the size of the wafer mounting face to the diameter of the wafer to be treated was 1.325 times or larger, the power consumption exceeded 300 W. On the contrary to that, in the case the size of the wafer mounting face to the diameter of the wafer to be treated was controlled to be 107.5 to 130%, the steady time temperature dispersion could be suppressed to 1° C., the transition time temperature dispersion to 10° C., and the power consumption was suppressed to 300 W or lower.

Although these experiments were carried out using the wafers W with a diameter of 200 mm, similar results were obtained in the case of the wafers W with a diameter of 300 mm.

Embodiment 9

A disk-like aluminum nitride sintered-based body with a thermal conductivity of 100 W/m/K or higher, an outer diameter of 200 mm, and pale gray color with lightness N=6 was obtained by mixing proper amounts of a binder and a solvent with an AlN powder with a purity of 93% and an average particle diameter of 1.2 μm and containing $Er_2O_3$ as a sintering aid and $SiO_2$ as an impurity to obtain a slurry, granulating the slurry by spray drying, and then molding the granulated mixture at 100 MPa and firing the molded product at 2,000° C. in vacuum atmosphere.

Evenly heating plates 2 with a disk-like shape of a thickness of 4 mm and an outer diameter of 200 mm were produced by grinding and polishing both main faces and the outer circumferential parts of silicon carbide sintered-based bodies produced in such a manner described above and further heated at 1,000° C. for 1 hour in atmospheric air to form an oxide film 24 which is about 0.5 μm size on the surface of each of the above-described sintered bodies. After that, a glass paste produced by kneading a glass powder with ethyl cellulose as binder and terpincol as an organic solvent was applied by a screen printing method and heated to 80° C. for drying the organic solvent and after that, degreasing treatment was carried out at 450° C. for 30 minutes and further baking was carried out at a temperature from 700 to 900° C. to form an insulating layer 4 of glass with a thickness of 400 μm. Then, in order to form a heating element 5 on the insulating layer 4, a glass paste mixed with a Au powder and a Pt powder as conductive materials was printed in a prescribed pattern shape by a screen printing method and then heated to 80° C. for drying an organic solvent and further heated at 450° C. for 30 minutes for degreasing treatment and baked at a temperature of 700 to 900° C. to form the heating element 5 with a thickness of 30 μm.

The heating element 5 was divided into 5 patterns including the center portion and 4 portions formed by dividing the circumferential portion in the circumferential direction. After that, electric supply portions 6 were fixed in the heating element 5 by a conductive adhesive to obtain each heat homogenizing plate 2.

Further, as a support 11, two sheets 3 in a 2.5 mm thick made of SUS 304 steel and each having an opening in 40% surface area of one main face were prepared and in one between them, a thermocouple 10 was formed and 10 electric communication terminals 7 were formed at prescribed positions, and both structure bodies were fixed on a side wall portion similarly made of SUS 304 steel according to JIS by screwing to obtain a support 11. Further, each heat homogenizing plate 2 was laid on the above-described support 11 and fastened in the outer circumferential part by screwing while an elastic body 8 being interposed between them to obtain a wafer heating apparatus 1 of the present invention as shown in FIG. 1.

Further, the support 11 mounting the an electric communication terminal 7 which has springs, was fastened in the outer circumferential part by screwing while an elastic body 8 being interposed between them to obtain a wafer heating apparatus 1 of the present invention as shown in FIG. 1.

The surface roughness Ra of the mounting faces 3 of the heat homogenizing plate s 2 were controlled to be Ra=0.1 μm, 0.6 μm, 0.8 μm, 3.2 μm, and 4.0 μm, and the mounting faces were coated with diamond-like carbon (DLC) in thickness of 0.5 μm and 2 μm by an ion plating method. Although the surface roughness of the heat homogenizing plate s 2 was not changed by the DLC coating of the thickness of 2 μm, however the color of the heat homogenizing plate s 2 was changed to be brown even if the DLC coating with the thickness of 0.5 μm. When the DLC coating thickness exceeded 1 μm, the heat homogenizing plate s 2 with the pale gray, the characteristic color of aluminum nitride, were turned to be black. The effects of the surface roughness of the heat homogenizing plate s 2 and the thickness of DLC coating on the lightness N standardized in JIS Z 8721 and the infrared emissivity ε were investigated and the results were shown in Table 8.

TABLE 8

| thick. of DLC coating (μm) | Ra (μm) | N | emissivity at lower than 100° C. | emissivity at not lower than 100° C. |
|---|---|---|---|---|
| without coating | 0.1 | 5.0 | 0.55 | 0.65 |
| 0.5 | 0.1 | 3.0 | 0.58 | 0.68 |
|  | 0.6 |  | 0.59 | 0.69 |
|  | 0.8 |  | 0.70 | 0.80 |
|  | 3.2 |  | 0.72 | 0.82 |
|  | 4.0 |  | 0.72 | 0.82 |
| 2 | 0.1 | 2.0 | 0.67 | 0.77 |
|  | 0.6 |  | 0.68 | 0.78 |
|  | 0.8 |  | 0.75 | 0.85 |
|  | 3.2 |  | 0.78 | 0.88 |
|  | 4.0 |  | 0.78 | 0.88 |

As being understood from Table 8, the infrared emissivity were found variously changed depending on the surface roughness Ra and the lightness N.

Of course, the infrared emissivity ε is changed depending on temperature, and the characteristics at 100° C. are important for the wafer heating apparatus 1 and therefore the wafer heating apparatus 1 is sufficient if it satisfies the required characteristics at 100° C. It is therefore no need to say it is better if the above-described infrared radiation characteristics are obtained by a ceramic alone composing the heat homogenizing plate s 2 without restriction only to the DLC coating.

Although the infrared emissivity ε was made possible to be increased by increasing the surface roughness Ra of the heat homogenizing plate s 2, an inconvenience that washing became difficult was found if the surface roughness Ra exceeded 3.2 μm. Accordingly the surface roughness Ra of the heat homogenizing plate 2 was better to be adjusted in a range from 0.8 to 3.2 μm. The infrared emissivity ε was the ratio relative to 1.0 of the infrared emissivity of a black body in vacuum and measured using Fourier transformation infrared spectrophotometer (FT/infrared-5M) manufactured by Nippon Photometry Industry.

Next, using each heat homogenizing plate 2, an experiment for heating a wafer W by radiation heat was carried out. Supporting pins with 2 mm Φ were set at 3 points of PCD of 180 mm so as to keep the distance between the heat homogenizing plate 2 and the wafer 50 μm and the saturation temperature of the wafer W was investigated when the heat homogenizing plate 2 was heated to 200° C. In this experiment, the wafer temperature at the portions where the wafer was supported by the supporting pins was neglected.

The results were shown in Table 9.

TABLE 9

| emissivity | temperature °C. of wafer W | Heating efficiency % | result |
|---|---|---|---|
| 0.65 | 174 | 87 | x |
| 0.78 | 180 | 90 | x |
| 0.80 | 196 | 98 | ⊚ |
| 0.82 | 197 | 98 | ⊚ |
| 0.85 | 198 | 99 | ⊚ |
| 0.88 | 198 | 99 | ⊚ |

From Table 9, it was found desirable to use heat homogenizing plate s 2 having 0.8 or higher infrared emissivity ε at wavelength λ=8 μm since the wafer was heated at 98% or higher efficiency in such a case. Further, it may be said that it was further preferable to use heat homogenizing plate s 2 having infrared emissivity ε≧0.85 with which 99% or higher efficiency was obtained.

Since the infrared absorptivity of the wafer W is changed depending on the wavelength and the temperature, radiation heating has to be carried out in the most efficient wavelength band. Therefore, in place of DLC, W and Ni were used for CVD coating to produce heat homogenizing plate s 2 giving the maximum infrared emissivity at different wavelength values. Similarly as described above, the saturation temperature of the wafer W was investigated when the heat homogenizing plate 2 was heated to 200° C. The results were shown in Table 10.

TABLE 10

| wavelength μm | temperature °C. of wafer W | Heating efficiency % | result |
|---|---|---|---|
| 3 | 172 | 86 | x |
| 6 | 194 | 97 | ○ |
| 8 | 196 | 98 | ⊚ |
| 13 | 194 | 97 | ○ |
| 15 | 172 | 86 | x |

From Table 10, it was found desirable to use heat homogenizing plate s 2 having wavelength λ in a range from 6 to 13 μm with which the infrared emissivity ε=0.8 was achieved or since the wafer was heated at 97% or higher efficiency in such a case. Further, it was found further preferable to use heat homogenizing plate s 2 having wavelength λ of 8 μm with which infrared emissivity ε=0.8 was achieve, since the heating efficiency of the wafer could be increased to the maximum.

Example 10

In the above-described experiment, the wafer temperature in the portions supported by the supporting pins was not taken into consideration, however, actually, the effect of heat conduction from the supporting pins can not be neglected. Therefore, an experiment regarding the wafer temperature unevenness caused by the supporting pins was carried out.

As shown in FIG. 2, samples were prepared in a manner that recessed parts were formed on each heat homogenizing plate 2 at points dividing the circumference of a 180 mm Φ circle concentric with the heat homogenizing plate 2 into 3 at equal intervals and the supporting pins were so set as to adjust the projection height from the mounting face 30 to be 30 μm, 50 μm, 100 μm, 300 μm, and 600 μm. Also, the diameters of the supporting pins were selected to be 1 mm, 2 mm, 5 mm, 10 mm, and 12 mm, and the contact surface area of the above-described supporting pins with the wafer W was changed to be 3 mm$^2$, 5 mm$^2$, 10 mm$^2$, 15 mm$^2$, and 20 mm$^2$ per every one supporting pin by processing the tip shape of the supporting pins to give samples, and the wafer temperature was investigated in the supporting pin portions and portions other than the supporting pins.

The heat homogenizing plate s 2 used had surface roughness Ra of 0.8 μm, was coated with the above-described 0.5 μm-thick DLC coating, and showed 0.80 infrared emissivity ε with wavelength λ=8 μm at 100° C. Further, the supporting pins 20 were made of an alumina ceramic with 99% purity and 20 W/m/K thermal conductivity.

The contact surface area of the above-described supporting pins and the wafer were made adjustable depending on the tip shape of the supporting pins and regardless of the tip shape of the supporting pins whether sharp or R face, the contact surface area of the above-described supporting pins and the wafer could be decreased.

The results obtained in such a manner were shown in Table 11.

TABLE 11

| pin height (μm) | pin diam. (mm) | contact area of pins and wafer (mm$^2$) | wafer temper. at pin portion (° C.) | wafer temper. at other than pin portion (° C.) | temper. distribution ΔT (° C.) | result |
|---|---|---|---|---|---|---|
| 30 | 5 | 5 | 199.8 | 197.7 | >2 | x |
| 50 | 5 | 5 | 198.9 | 197.2 | <2 | ○ |
| 100 | 5 | 5 | 197.9 | 196.0 | <2 | ○ |
| 300 | 5 | 5 | 197.7 | 196.7 | <2 | ○ |
| 500 | 5 | 5 | 197.1 | 195.8 | <2 | ○ |
| 600 | 5 | 5 | 196.2 | 194.1 | >2 | x |
| 100 | 1 | 0.7 | 193.8 | 196.0 | >2 | x |
| 100 | 2 | 5 | 194.5 | 196.0 | <2 | ○ |
| 100 | 5 | 5 | 197.0 | 196.0 | <2 | ○ |
| 100 | 10 | 5 | 197.8 | 196.0 | <2 | ○ |
| 100 | 12 | 5 | 198.3 | 196.0 | >2 | x |
| 100 | 5 | 3 | 195.2 | 196.0 | <1 | ⊚ |
| 100 | 5 | 10 | 197.8 | 196.0 | <2 | ○ |
| 100 | 5 | 15 | 198.6 | 196.0 | >2 | x |
| 100 | 10 | 20 | 198.9 | 196.0 | >2 | x |

From Table 11, it was found that the temperature distribution in the wafer could preferably be kept 2° C. or lower if the production height of the supporting pins on the bases of the mounting face of the wafer was in a range from 0.05 to 0.5 mm, the diameter of the above-described supporting pins was in a range from φ2 to φ10 mm, and the contact surface area of the above-described supporting pins with the water W per every one supporting pin was 10 mm$^2$ or smaller.

When the contact surface area of the above-described supporting pins with the water W exceeded 10 mm$^2$, the heat transmission amount in the supporting pin portions increased and the wafer temperature in the portions were found temperature unevenness. The temperature unevenness was judges to be inferior in the case it was 2° C. or higher, qualified in the case it was lower than 2° C., and especially excellent in the case it was lower than 1° C.

As a result, the contact surface area of the above-described supporting pins with the wafer W per every one supporting pin was found preferable to be 10 mm$^2$ or smaller and more desirable to be 3 mm$^2$ or smaller.

The same results as described above were obtained in the case of using a silicon carbide ceramic with 0.80 infrared emissivity ε with wavelength λ=8 μm at 100° C. or higher for the heat homogenizing plate 2 and an alumina ceramic with alumina ceramic with 93% purity and 15 W/m/K thermal conductivity for the supporting pins 20.

What is claimed is:

1. A wafer heating apparatus comprising: a heat homogenizing plate of a ceramic having one main face for mounting a wafer; a heating element composed of a plurality of resister strips which are attached on other main surface or inside thereof; and electric supply portions electrically connected with the plurality of the resistor strips of the heating element;

wherein the heating element satisfies the following relations:

$0.15 \leq S \leq 0.85$, $0.3 \leq P \leq 6.71 \times S^2 + 1.52$, and $0.3 \leq G \leq 6.71 \times (1-S)^2 + 1.55$, wherein S is the ratio of the total surface area of the resistor strips included within a 10 mm square region selected from within an effective heat generation area on the heat homogenizing plate;

P is the width of the resister strips in mm; and G is a gap width in mm between the adjacent resister strips of the heating element.

2. The wafer heating apparatus according to claim 1, wherein the heat homogenizing plate has a thickness of 1 to 8 mm.

3. The wafer heating apparatus according to claim 1, wherein the outer diameter of the circular heating element is within a range of 1.02 to 1.20 times as large as that of the wafer to be mounted on the heat homogenizing plate.

4. The wafer heating apparatus according to claim 1, wherein the temperature coefficient of resistance of the resister strips is $3,000 \times 10^{-6}$/° C. or less.

5. The wafer heating apparatus according to claim 1, wherein the resister strips of the heating element are partially trimmed for controlling the heating amount.

6. A wafer heating apparatus comprising: a heat homogenizing plate of a ceramic having one main face for mounting a wafer; a heating element composed of a plurality of resister strips which are attached on other main surface or inside thereof; electric supply portions electrically connected with the plurality of the resistor strips of the heating element; and a casing for supporting the heat homogenizing thereon wherein said heating element satisfies the following relations:

$Y \geq 0.02X + 0.7$;

$Y > -0.02X + 0.9$;

$Y \leq -0.02X + 1.08$;

$Y \leq 0.96$; and $2 \leq X \leq 8$, wherein Y is the ratio of the outer diameter of the circular heating element to the outer diameter of the circular heat homogenizing plate; and X is the thickness in mm of the heat homogenizing plate.

7. The wafer heating apparatus according to claim 6, wherein the distance between the inner edge of the plate holding part, for holding the heat homogenizing plate, of the casing and the outer edge of the circular heating element is set to be 2 mm or more; and the outer diameter of said heating element is set wider than the outer diameter of a wafer by 5 mm or more.

8. The wafer heating apparatus according to claim 6, wherein the outer diameter of the circular heating element is within a range from 1.075 to 1.30 times as large as that of a wafer to be mounted.

9. A wafer heating apparatus comprising: a heat homogenizing plate of a ceramic having one main face for mounting a wafer; a heating element composed of a plurality of resister strips which are attached on other main surface or inside thereof; and electric supply portions electrically connected with the plurality of the resistor strips of the heating element, wherein the heat homogenizing plate has a plurality of supporting pins thereon for supporting the wafer over the mounting surface; and the heat homogenizing plate has emissivity $\epsilon$ of 0.8 or higher with respect to infrared rays of wavelength $\lambda$ of 8 $\mu$m at 100° C. or higher.

10. The wafer heating apparatus according to claim 9, wherein the supporting pins have projection heights of 0.05 to 0.5 mm on the bases of the one main face for mounting the wafer.

11. The wafer heating apparatus according to claim 9, wherein the diameter of the supporting pins is 2 to 10 mm and the contact surface area of the supporting pins with a wafer is 10 mm$^2$ or less each supporting pin.

* * * * *